US007860674B2

(12) United States Patent
Freidhof et al.

(10) Patent No.: US 7,860,674 B2
(45) Date of Patent: Dec. 28, 2010

(54) METHOD AND SYSTEM FOR SECURE DIGITAL TRIGGERING FOR AN OSCILLOSCOPE

(75) Inventors: Markus Freidhof, Kirchseeon (DE); Johann Huber, Markt Schwaben (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 292 days.

(21) Appl. No.: 11/997,061

(22) PCT Filed: Apr. 24, 2006

(86) PCT No.: PCT/EP2006/003756

§ 371 (c)(1),
(2), (4) Date: May 19, 2008

(87) PCT Pub. No.: WO2007/012355

PCT Pub. Date: Feb. 1, 2007

(65) Prior Publication Data

US 2008/0297139 A1 Dec. 4, 2008

(30) Foreign Application Priority Data

Jul. 27, 2005 (DE) .................. 10 2005 035 473

(51) Int. Cl.
*G01R 13/20* (2006.01)
*G06F 17/40* (2006.01)
(52) U.S. Cl. ................. 702/69; 702/66; 702/67; 702/71; 324/76.15
(58) Field of Classification Search .......... 702/69, 702/66, 67, 71
See application file for complete search history.

(56) References Cited

U.S. PATENT DOCUMENTS

| 4,585,975 | A | | 4/1986 | Wimmer |
| 5,352,976 | A | * | 10/1994 | Walker et al. .......... 324/121 R |
| 5,854,996 | A | * | 12/1998 | Overhage et al. .......... 702/189 |
| 6,263,290 | B1 | * | 7/2001 | Williams et al. .......... 702/71 |
| 6,598,004 | B1 | | 7/2003 | Ishida et al. |
| 6,753,677 | B1 | * | 6/2004 | Weller et al. .......... 324/121 R |
| 2003/0115003 | A1 | * | 6/2003 | Saitou et al. .......... 702/66 |

FOREIGN PATENT DOCUMENTS

| DE | 3936932 | 5/1990 |
| DE | 3687348 T | 7/1993 |

(Continued)

OTHER PUBLICATIONS

International Search Report of PCT/EP2006/003756, mailed Jul. 20, 2006.

(Continued)

*Primary Examiner*—Hal D Wachsman
(74) *Attorney, Agent, or Firm*—Ditthavong Mori & Steiner, P.C.

(57) ABSTRACT

An approach is provided for digital triggering a recording of one or more digitized signals on a digital oscilloscope by means of carrying out a level comparison for determining a triggering instant in each case between two successive sample values of a reference signal and a threshold values. According to the approach, at least one additional sample value of the reference signal is determined between two sequential samples of the reference signals by means of interpolation.

23 Claims, 17 Drawing Sheets

FOREIGN PATENT DOCUMENTS

| | | |
|---|---|---|
| DE | 69322530 T | 9/1999 |
| EP | 0279480 | 4/1993 |
| EP | 0554973 | 8/1993 |
| EP | 0740161 A2 | 10/1996 |

OTHER PUBLICATIONS

Hancock, J., "Zeitintervall-Messgenauigkeit von Digital-Oszilloskopen," Elektronik, Weka Fachzeitschriftenverlag, Poing, DE, vol. 37, No. 1, Jan. 8, 1988, pp. 94-97, XP000955160, (No translation).

"Bisection method" [online] Jul. 26, 2004, Wikipedia, XP002389052, Retrieved from the Internet: URL:http://web.archive.org/web/20040726154027/http://en.wikipedia.org/wiki/Bisection_method> [retrieved on Jul. 5, 2006].

International Preliminary Report on Patentability for Application No. PCT/EP2006/006368, mailed Jun. 19, 2008.

PCT/EP2006/003756 International Preliminary Report on Patentability (IPRP) dated Jul. 17, 2008.

* cited by examiner

METHOD AND SYSTEM FOR SECURE DIGITAL TRIGGERING FOR AN OSCILLOSCOPE

CROSS-REFERENCE TO RELATED APPLICATION

The present application is a national phase application of PCT Application No. PCT/Ep2006/003756, filed on Apr. 24, 2006, and claims priority to German Application No. 10 2005 035 473.4, filed on Jul. 28, 2005, the entire contents of which are herein incorporated by reference.

FIELD OF THE INVENTION

The invention, according to various embodiments, relates to triggering of an oscilloscope.

BACKGROUND OF THE INVENTION

Digital oscilloscopes as shown in FIG. 1 consist of an input amplifier, of which the variable amplification factor is used to match the amplitude of the measured signal to be displayed on the oscilloscope with the measurement range of the oscilloscope; a downstream analog-digital converter for generating sampled values of the digitized measured signal; a recording unit for presenting over time the sampled values of the digitized measured signal; and a triggering system connected in parallel to the analog-digital converter for phase-corrected or respectively time-corrected presentation in the recording unit of the signal portion of the measured signal identified with the triggering threshold of the analog triggering system.

Via several comparators, an analog triggering system shown in FIG. 2—for the sake of simplicity, only one measured signal is used for triggering in the triggering system of FIG. 2—compares the measured signal present at the respective input A, and pre-amplified with reference to its amplitude, in each case with reference to overshooting or undershooting the level of a threshold-value signal present at the input B, in order to form complex triggering conditions. The respective, variable threshold values 1 . . . N are stored in digitized form in a register. A triggering signal for the correct presentation of the required signal portion of the measured signal in the recording unit is generated in an evaluation unit connected downstream of the comparators dependent upon the respectively-set triggering condition and subject to the occurrence of the triggering condition.

If the intersection of the threshold-value signal with the measured signal to be recorded—triggering point—is disposed between two sampled values of the digitized, measured signal to be recorded, a triggering offset is provided, as shown in FIG. 3, between the triggering point and the next sampled value or respectively between the triggering point and the preceding sampled value of the digitized, measured signal to be recorded. This triggering offset leads to a phase offset in the presentation of the measured signal in the recording unit between the measured signal to be recorded and the coordinate origin of the recording unit.

This phase offset—jitter—between the measured signal to be recorded and the coordinate origin of the recording unit is also known in analog oscilloscopes and is presented in FIG. 4. In FIG. 4, a jitter of 0.3 display units on the screen of the oscilloscope is evident for a triggering threshold of 0 V.

It is known from analog oscilloscopes that this jitter adopts either a constant value—systematic jitter —, if the distance between triggering point and the next sampled value of the digitized measured signal is largely unchanged under stable conditions, or a statistical value—statistical jitter—for example, if stochastic phase noise is superposed on the measured signal.

In addition to these phase errors in the oscilloscope display resulting from time discretisation of the measured signal and stochastic phase noise of the measured signal, undesired jitter can also result from different delay times in the measurement channels of measured signals, which are used in combination for checking the triggering condition. In this context, it is also a disadvantage that the triggering condition may not occur at all, and accordingly, the measured signals are not even presented on the oscilloscope screen.

The fact that phase and respectively time errors in the two paths of the measured signal—analog-digital converter or triggering system—are mutually superposed and under extreme conditions can bring about a doubling of the effect can be seen as an additional disadvantage.

DE 39 36 932 A1 discloses a triggering-signal generator for an oscilloscope, which generates the triggering signal in a digital manner.

SUMMARY OF THE INVENTION

In accordance with various embodiments of the invention, a triggering method, a triggering system and a corresponding digital oscilloscope are provided for a secure triggering, corresponding to the selected triggering condition, of the recording of one or more measured signals on the display unit of the oscilloscope with a higher time resolution than the sampling rate of the analog-digital converter used in the digital oscilloscope.

According to an embodiment of the invention, a digital triggering system is used instead of the analog triggering with its associated disadvantages. In this context, during the triggering process, the sampled values of the digitized measured signal used as a reference signal are compared successively with a threshold value. According to a first embodiment of the invention, if an overshooting of the threshold value by the digitized reference signal occurs within two sampled values—first sampled value<threshold value, second sampled value>threshold value, or if an undershooting of the threshold-value signal by the digitized reference signal occurs within two sampled values—first sampled value>threshold value, second sampled value<threshold value, the exact triggering time is determined by calculating several additional sampled values of the reference signal, which are disposed between the two sampling times at an equal distance from one another, and the exact time of the overshooting or undershooting of the threshold value by the reference signal is determined by a further comparison of all additional sampled values of the reference signal with reference to overshooting or undershooting the threshold value. In this manner, an occurring triggering offset can be minimized corresponding to the number of selected, additional, sampled values of the reference signal, which are calculated by means of interpolation—preferably by means of polyphase filter.

According to a second embodiment of the invention, in order to minimize the number of additional sampled values of the reference signal to be calculated and therefore to realize a delay-time-optimized triggering, instead of a fixed number of additional sampled values of the reference signal, an additional sampled value of the reference signal is calculated iteratively in each case in the middle of the time interval observed in the respective iterative step by means of interpolation with polyphase filters, and a comparison with reference to an overshooting or undershooting of a threshold value is implemented. Starting from the result of the comparison—overshooting or undershooting—, the next iterative step uses the halved time interval disposed on the left or the right side of the respective, additional, sampled value of the reference signal.

According to a third embodiment of the invention, after the iterative halving of the time intervals corresponding to the second embodiment of the invention, an additional sampled value of the reference signal is calculated within the time interval of the last iterative step by means of linear interpolation.

According to a fourth embodiment of the invention, if the triggering time between two respectively-successive sampled values of the digitized measured signal is erroneously not identified as a result of the absence of an overshooting or undershooting of the threshold value by the reference signal (threshold value is disposed either above or below two successive sampled values of the reference signal), additional sampled values of the reference signal should be calculated between the two sampling times by means of interpolation with polyphase filters, in order to identify a possible overshooting or undershooting of the threshold value by two successive, (additional) sampled values of the reference signal.

According to a fifth embodiment of the invention, in order to minimize the number of additional sampled values of the reference signal to be calculated, the number of calculations to be implemented is significantly minimized by comparison with the fourth embodiment of the invention by iterative halving of the time interval, subsequent calculation of an additional sampled value of the reference signal disposed in the middle of the respective time interval and comparison of the additional sampled value of the reference signal with the threshold value.

By analogy with the third embodiment of the invention, there is also a sixth embodiment, in which the additional sampled value of the reference signal is determined in the last iterative step by means of linear interpolation from the additional sampled values of the reference signal calculated in the two preceding iterative steps by interpolation with a polyphase filter.

In order to reduce the sensitivity of the triggering system, a comparison with two threshold values—equivalent to a comparator with hysteresis—is implemented. In the case of an overshooting, the upper threshold value is used, while the lower threshold value is used in the case of an undershooting.

Different delay times in the measurement channels associated with the individual measured signals are registered via a calibration procedure and compensated in the individual measured signals, before the reference signal is determined from the individual measured signals for the digital triggering or respectively before the sampled values of the individual measured signals are presented on the screen of the oscilloscope.

Still other aspects, features, and advantages of the present invention are readily apparent from the following detailed description, simply by illustrating a number of particular embodiments and implementations, including the best mode contemplated for carrying out the present invention. The present invention is also capable of being embodied within other and different embodiments, and its several details can be modified in various obvious respects, all without departing from the spirit and scope of the present invention. Accordingly, the drawings and description are to be regarded as illustrative in nature, and not as restrictive.

BRIEF DESCRIPTION OF THE DRAWINGS

Various exemplary embodiments are illustrated by way of example, and not by way of limitation, in the figures of the accompanying drawings in which like reference numerals refer to similar elements and in which.

DETAILED DESCRIPTION OF THE PREFERRED EMBODIMENTS

Figure 1:
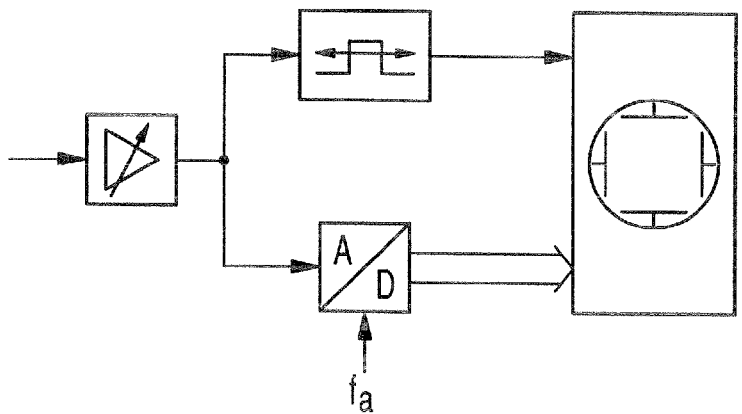
FIG. 1 shows a block-circuit diagram of a conventional digital oscilloscope with an analog triggering system.
Figure 2:
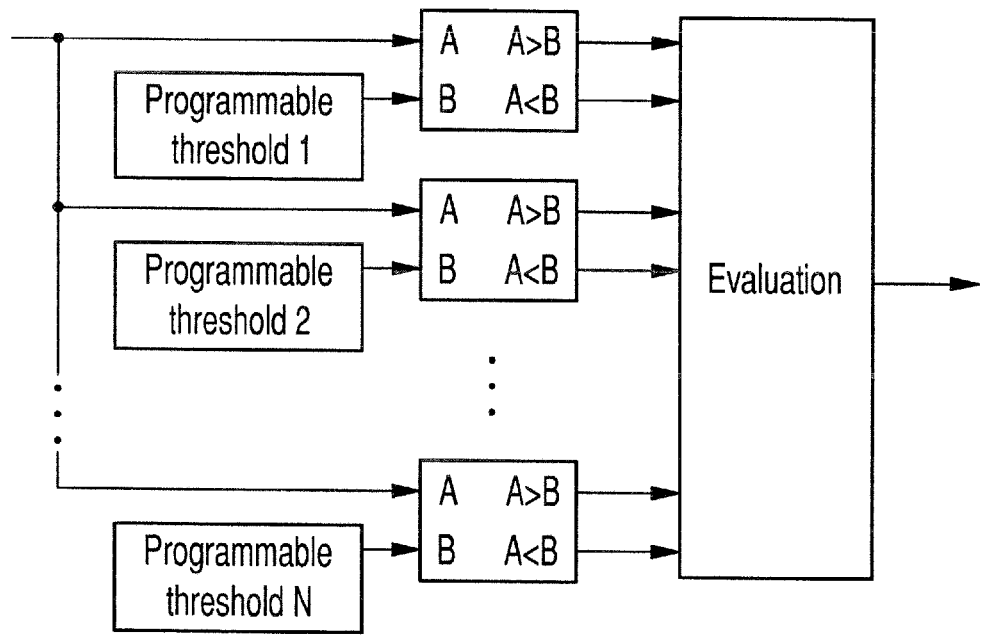
FIG. 2 shows a block-circuit diagram of a conventional analog triggering system.
Figure 3:
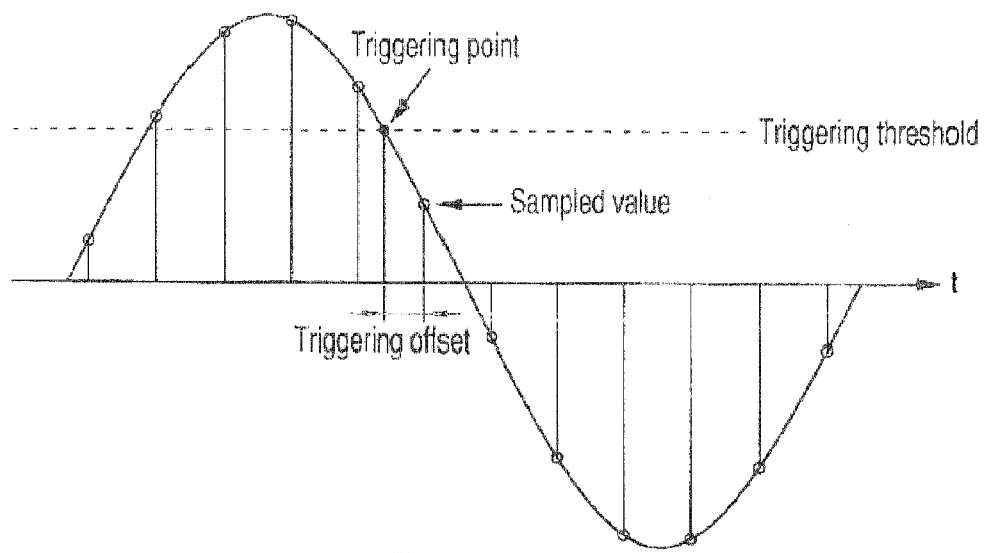
FIG. 3 shows a conventional time characteristic of the digitized measured signal with triggering offset, according to an exemplary embodiment.
Figure 4:
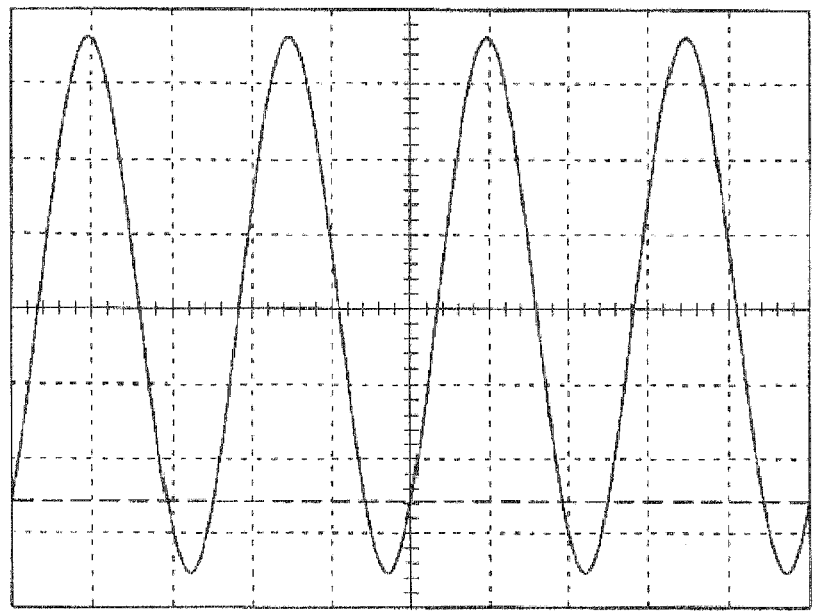
FIG. 4 shows a conventional graphic presentation of a display device of an oscilloscope with an erroneously-presented measured signal with analog triggering, according to an exemplary embodiment.
Figure 5:
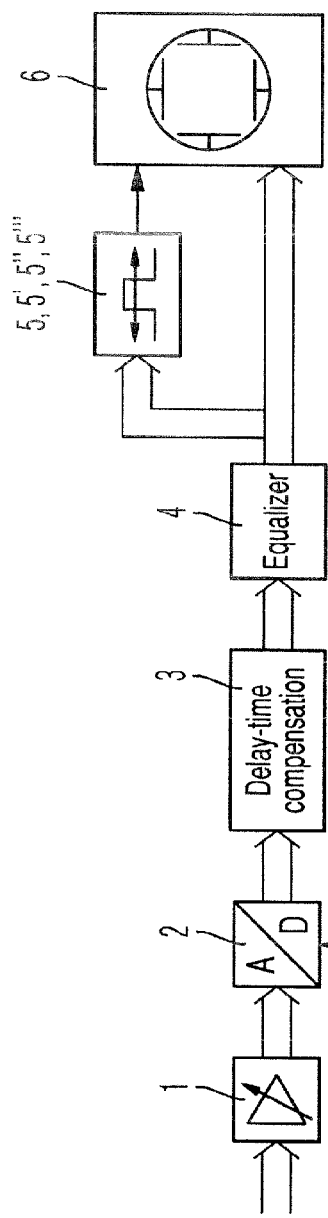
FIG. 5 shows a block-circuit diagram of a digital oscilloscope with digital triggering system, according to an exemplary embodiment.

The digital oscilloscope shown in FIG. 5 matches the amplitude level of the measured signal disposed at its input with the measurement range of the display device 5 using a pre-amplifier 1, which provides a variable amplification factor. After the level matching, the pre-amplified, analog measured signals are supplied to an analog-digital converter 2 for conversion into a corresponding digital data format.

An adjacent unit for compensation of delay times 3 compensates different delay times in the measurement channels associated with the individual measured signals. An equalizer system 4, which implements an equalization of the linear, or respectively non-linear, distorted, digitized measured signals is optionally disposed downstream. The linear or respectively non-linear distortions of the measured signals result from the transmission behaviour of the transmission elements of the measurement channel as a whole (sensors, measurement lines, pre-amplifier and analog-digital converter).

After the equalization, the digitized measured signal is checked by a digital triggering system 5 with reference to an adjustable triggering condition, and in the case of an identification of this triggering condition, a triggering signal for triggering the digital oscilloscope is generated in the measured signal at the output of the digital triggering system 5. Those sampled values of the digitized, equalized measured signal, which are registered simultaneously with the triggering signal or immediately following the triggering signal in time, are presented on a screen of the recording unit 6 of the digital oscilloscope.

Figure 6A:
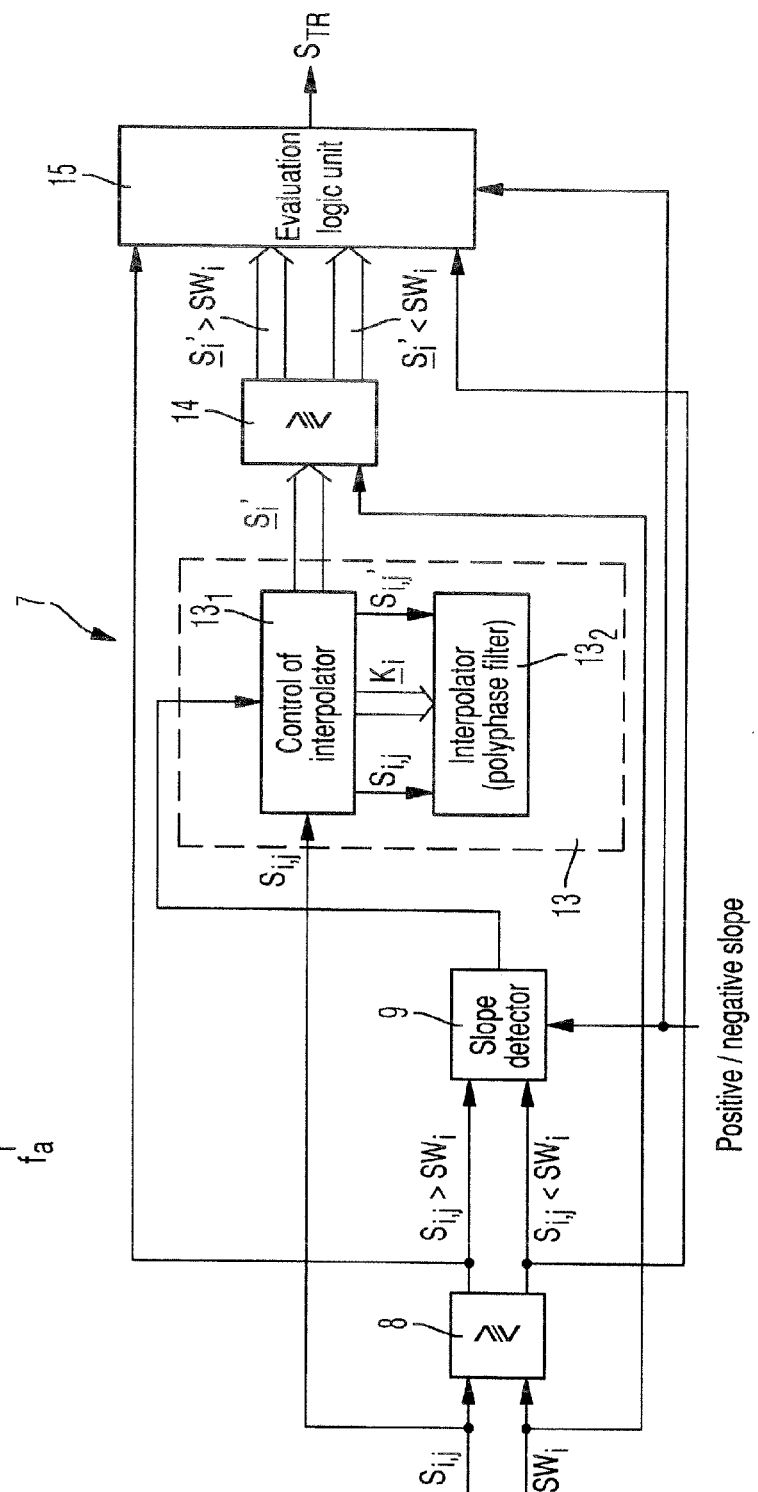
FIGS. 6A, 6B, 6C show block-circuit diagrams of a the first, second and third embodiments of a unit for generating digital triggering signals, according to certain embodiments.
Figure 6B:
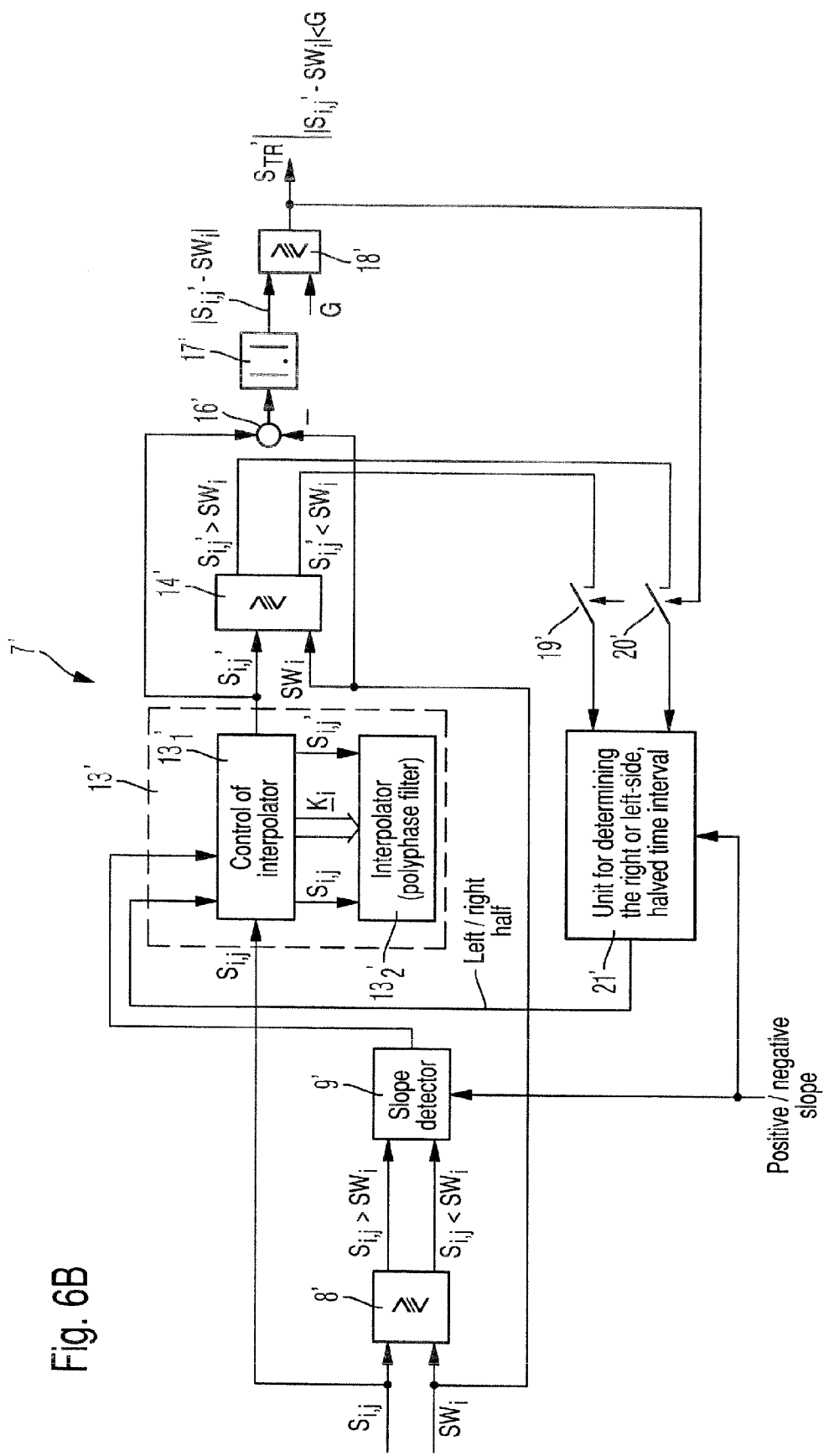
Figure 6C:
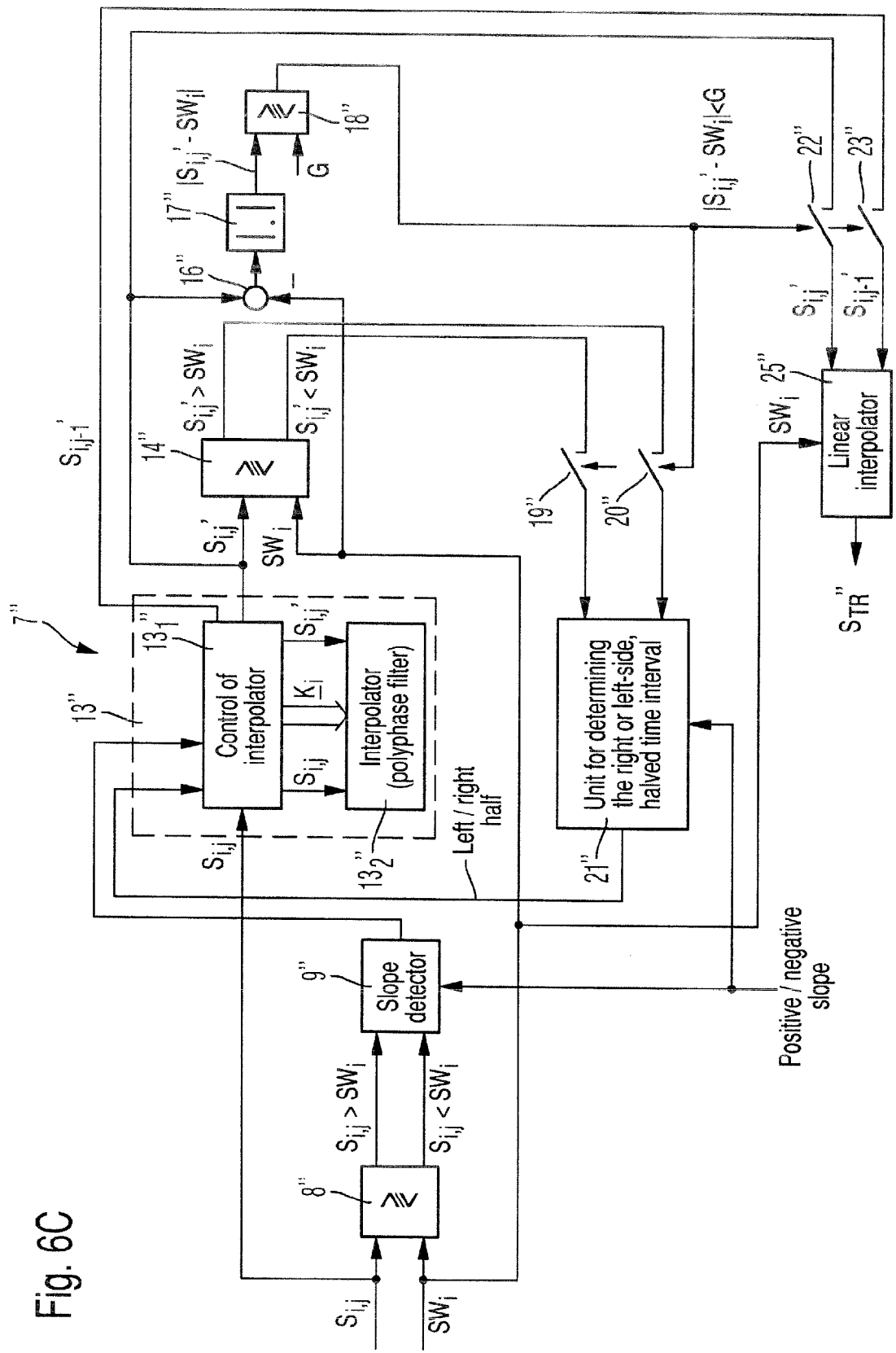

Before describing the first, second, third and fourth embodiments of the system for digital triggering with reference to FIGS. 7A, 7B, 7C and 7D of the drawings, the following section presents the first, second and third embodiments of a unit for generating triggering signals, which is incorporated alternatively in all of these embodiments of a system for digital triggering, with reference to FIGS. 6A, 6B, 6C:

In a first embodiment 7 of a unit for generating digital signals shown in FIG. 6A, one signal $S_i$ from several signals S to be presented in a digital oscilloscope is used as a reference signal $S_i$ for generating a triggering signal $S_{TR}$. For this purpose, the sampled values $S_{i,j}$ of the reference signal $S_i$ and a threshold value $SW_i$ are supplied respectively to an input of a comparator 8. The comparator 8 compares the sampled value $S_{i,j}$ of the digitized reference signal $S_i$ with the threshold value $SW_i$ and activates a first output in the case of an overshooting of the threshold value $SW_i$ by the sampled value $S_{i,j}$ of the reference signal $S_i$, or respectively a second output, in the case of an undershooting of the threshold value $SW_i$ by the sampled value $S_{i,j}$ of the reference signal $S_i$.

In a slope detector 9 connected downstream of the comparator 8, dependent upon a positive or negative slope triggering and upon the two signals at the two outputs of the comparator 8, an overshooting or undershooting of the threshold value $SW_i$ by two successive sampled values $S_{i,j}$ and $S_{i,j+1}$ of the reference signal $S_i$ is identified by an activation of the output of the slope detector 9.

The sampled values $S_{i,j}$ of the reference signal $S_i$ are supplied to a unit 13 for determining additional, sampled values $S_i'$ of the reference signal $S_i$ disposed at an equal distance between two successive sampled values $S_{i,j}$ and $S_{i,j-1}$. This unit 13 consists of the actual interpolator 13₂, which is preferably a polyphase filter, and a unit 13₁ for controlling the interpolator.

The unit 13₁ for controlling the interpolator reads in the individual sampled values $S_{i,j}$ of the reference signal $S_i$ in a cyclical manner and buffers them. The output signal of the slope detector 9 activated in the case of an overshooting or undershooting of the threshold value $SW_i$ by two successive sampled values $S_{i,j}$ and $S_{i,j-1}$ of the reference signal $S_i$ is used by the unit 13₁ for controlling the interpolator 13₂ for the sequential transfer to the interpolator 13₂ of a given number of sampled values $S_{i,j}$ of the reference signal $S_i$, which have been read in and buffered, and which are disposed before or respectively after the identified slope event. Additionally, the unit 13₁ for controlling the interpolator transfers to the interpolator 13₂ the associated filter coefficients $K_i$ for the calculation of the respective additional sampled value $S_{i,j}'$ of the reference signal $S_i$. The additional sampled value $S_{i,j}'$ of the reference signal $S_i$ calculated in each case by the polyphase filter 13₂ is read in and buffered by the unit 13₁ for controlling the interpolator. When all of the additional sampled values $S_{i,j}'$ of the reference signal $S_i$ have been calculated by the interpolator 13₂, the unit 13₁ for controlling the interpolator outputs all calculated and buffered additional sampled values $S_i'$ of the reference signal $S_i$.

The additional sampled values $S_i'$ of the reference signal $S_i$ are read into a downstream comparator 14 and compared in each case with the threshold value $SW_i$. The comparator 14 provides for each of the additional sampled values $S_i'$ of the reference signal $S_i$ respectively two outputs, of which one output is activated in the case of an overshooting of the threshold value $SW_i$ by the additional sampled value $S_{i,j}'$ of the reference signal $S_i$, and the other output is activated respectively in the case of an undershooting of the threshold value $SW_i$ by the additional sampled value $S_{i,j}'$ of the reference signal $S_i$.

Dependent upon a positive or negative slope triggering and upon the signals disposed at the individual outputs of the comparator 14, a final evaluation logic unit 15 determines the additional sampled value $S_{i,j}'$ of the reference signal $S_i$, which provides the shortest distance from the threshold value $SW_i$ and which represents the sought-after triggering time for the triggering signal $S_{TR}$.

In order to minimize the plurality of necessary additional sampled values $S_i'$ of the reference signal $S_i$ of the first embodiment 7 of a unit for generating triggering signals, a second embodiment 7' of a unit for generating triggering signals is described below with reference to FIG. 6B, which requires a minimised number of additional sampled values $S_i'$ of the reference signal $S_i$ for the determination of the triggering time.

In a manner equivalent to the first embodiment 7 of the unit for generating triggering signals, the second embodiment 7' of the unit for generating triggering signals compares the individual sampled values $S_{i,j}$ of the reference signal $S_i$, which are selected from several signals S to be presented on the digital oscilloscope, with the threshold value $SW_i$ in a comparator 8'. The comparison leads to an activation of a first output of the comparator 8' in the case of an overshooting of the threshold value $SW_i$ respectively by two successive sampled values $S_{i,j}$ and $S_{i,j-1}$ of the reference signal $S_i$, and to an activation of a second output of the comparator 8' in the case of an undershooting of the threshold value $SW_i$ respectively by two successive sampled values $S_{i,j}$ and $S_{i,j-1}$ of the reference signal $S_i$. A slope detector 9' connected downstream of the comparator 8' determines from the two signals disposed at the first or second output of the comparator 8', whether, dependent upon a positive or negative slope triggering, an overshooting or an undershooting of the threshold value $SW_i$ respectively by two successive sampled values $S_{i,j}$ and $S_{i,j-1}$ of the reference signal $S_i$ is present and activates the output of the slope detector 9' in the case of an overshooting or undershooting.

The sampled values $S_{i,j}$ of the reference signal $S_i$ are supplied to a unit 13' for determining additional sampled values $S_i'$ of the reference signal $S_i$ disposed between two successive sampled values $S_{i,j}$ and $S_{i,j-1}$. This unit 13' consists of the actual interpolator 13₂', which is preferably a polyphase filter, and a unit 13₁, for controlling the interpolator.

In a first iterative step, by analogy with the first embodiment, by means of interpolation in a polyphase filter within the unit 13' for determining additional sampled values $S_i'$ of the reference signal $S_i$, the additional sampled value $S_{i,j}'$ of the reference signal $S_i$ is determined in the middle of the time interval, which is defined by the two sampled values $S_{i,j}$ and $S_{i,j-1}$ of the reference signal $S_i$ disposed respectively before and after the identified slope event. In all subsequent iterative steps j, the unit 13 for determining additional sampled values $S_i'$ of the reference signal $S_i$ determines the additional sampled value $S_{i,j}'$ of the reference signal $S_i$ in the middle of the time interval, which is established by the additional sampled value $S_{i,j-1}'$ of the reference signal $S_i$ determined in the preceding iterative step j−1 and the time-interval threshold determined in the preceding iterative step j−1, which is disposed in the direction of the threshold value $SW_i$ relative to the additional sampled value $S_{i,j-1}'$ of the reference signal $S_i$ determined in the preceding iterative step j−1.

In a subsequent comparator 14', the additional sampled value $S_{i,j}'$ of the reference signal $S_i$ determined in the iterative step j is compared with reference to overshooting or undershooting the threshold value $SW_i$, and in the case of an overshooting of the threshold value $SW_i$ by the additional sampled value $S_{i,j}'$ of the reference signal $S_i$, a first output is activated, and in the case of an undershooting of the threshold value $SW_i$ by the additional sampled value $S_{i,j}'$ of the reference signal $S_i$, a second output is activated.

From the additional sampled value $S_{i,j}'$ of the reference signal $S_i$ determined in the unit 13' for determining additional sampled values $S_i'$ of the reference signal $S_i$ in the iterative step j and the threshold value $SW_i$, the level difference between the additional sampled value $S_{i,j}'$ of the reference signal $S_i$ and the threshold value $SW_i$ is formed in a subtractor 16' and supplied to a downstream modulus former 17'. In a further comparator 18', the determined modulus of the level difference between the additional sampled value $S_{i,j}'$ of the reference signal $S_i$ and the threshold value $SW_i$ is compared with a limit value G. In the case of an undershooting of the limit value G by the modulus of the level difference between the additional sampled value $S_{i,j}'$ of the reference signal $SW_i$ and the threshold value, an additional sampled value $S_{i,j}'$ of the reference signal $S_i$ is identified, which is disposed nearest to the triggering point and which accordingly forms the triggering time of a triggering signal $S_{TR}$ generated at the output of the comparator 18'.

So long as the triggering signal $S_{TR}$ is not activated, the two switches 19' and 20' are closed and the two signals present at the output of the comparator 14', which indicate respectively an overshooting or undershooting of the threshold value $SW_i$ by the additional sampled value $S_{i,j}'$ of the reference signal $S_i$ determined in the iterative step j, are passed on to the unit 21' for determination of the halved time interval on the left or right side. Dependent upon an overshooting or an undershooting of the threshold value $SW_i$ by the additional sampled value $S_{i,j}'$ of the reference signal $S_i$ determined in the iterative step j, the unit 21' for determination of the halved time interval on the left or right side determines the half of the time interval observed in the iterative step j disposed on the left or right side of the additional sampled value $S_{i,j}'$ of the reference signal $S_i$ determined in the iterative step j for the determination of the additional sampled value $S_{i,j-1}'$ of the reference signal $S_i$ in the next iterative step j+1. The information regarding the left or right half of the time interval of the current iterative step j used in the next iterative step j+1 is supplied by the unit 21' in order to determine the halved time interval on the left or right side, to the unit 13$_1$' for controlling the interpolator of the unit 13' for the determination of additional sampled values $S_i'$ of the reference signal $S_i$.

As a result of the iterative halving of the respective time interval and the level comparison based upon the latter between the additional sampled value $S_{i,j}'$ of the reference signal $S_i$ disposed in the respective middle of the time interval relative to the threshold value $SW_i$, the second embodiment of the unit for generating triggering signals leads to a minimized number of additional sampled values $S_i'$ of the reference signal $S_i$ by comparison with the first embodiment of the unit for generating triggering signals.

The third embodiment 7" of the unit for generating triggering signals shown in FIG. 6C is based upon the second embodiment 7' of the unit for generating triggering signals shown in FIG. 6B, in that, in the last iterative step j+1, as soon as the modulus of the level difference between the additional sampled value $S_{i,j}'$ of the reference signal $S_i$ determined in the iterative step j and the threshold value $SW_i$ undershoots a limit value G, an additional sampled value $S_{i,j+1}'$ of the reference signal $S_i$, of which the time value represents the sought-after triggering time for the triggering signal $S_{TR}"$, is determined via a linear interpolation from the additional sampled values $S_{i,j}'$ and $S_{i,j-1}'$ of the reference signal $S_i$ determined in the two preceding iterative steps j and j−1.

For this purpose, the third embodiment 7" of the unit for generating triggering signals shown in FIG. 6C provides the identical functional units to the second embodiment 7' of the unit for generating triggering signals (reference numbers 8" to 21"). Additionally, according to FIG. 6C, the additional sampled values $S_{i,j}'$ and $S_{i,j-1}'$ of the reference signal $S_i$ buffered in the unit 13" for controlling the interpolator of the unit 13" for the determination of additional sampled values $S_i'$ of the reference signal $S_i$ are supplied via the two switches 22" and 23" to the linear interpolation 25", as soon as the comparator 18" has identified an undershooting of the modulus of the level difference between the additional sampled value $S_{i,j}'$ of the reference signal $S_i$ determined in the iterative step j and the threshold value $SW_i$. The linear interpolator 25" determines, via a linear interpolation from the additional sampled values $S_{i,j}'$ and $S_{i,j-1}'$ of the reference signal $S_i$ and its associated sampling times and the threshold value $SW_i$, an intersection between threshold value $SW_i$ and reference signal $S_i$ within the "local range" as a triggering time of the triggering signal $S_{TR}"$.

Figure 7A:
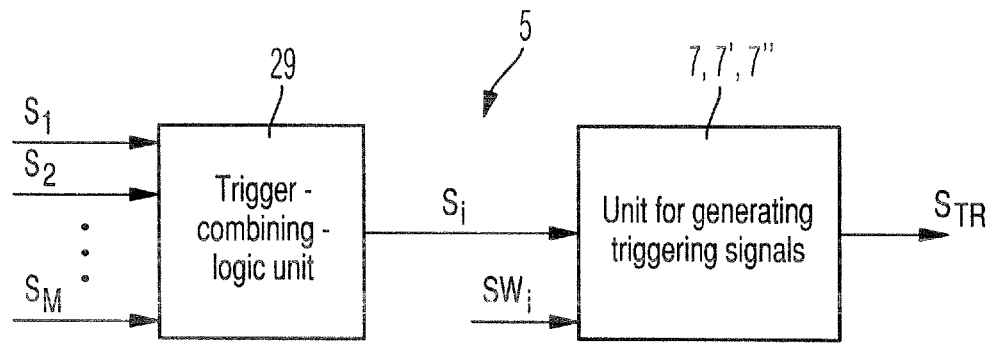
FIGS. 7A, 7B, 7C and 7D show block-circuit diagrams of a the first, second, third and fourth embodiments of a system for digital triggering.

In view of the first, second and third embodiments 7, 7', 7" of the unit for generating triggering signals as presented in FIGS. 6A, 6B and 6C, the first, second, third and fourth embodiments 5, 5', 5" and 5''' of the system for digital triggering will now be presented with reference to FIGS. 7A, 7B, 7C and 7D:

In a first embodiment 5 of the system for digital triggering shown in FIG. 7A, in order to form a reference signal $S_i$, several signals $S_1, S_2, \ldots, S_N$ from all of the signals S to be presented on the digital oscilloscope are combined via a preceding trigger-combining logic unit 29. The reference signal $S_i$ is compared with a threshold value $SW_i$ in a unit for generating triggering signals 7, 7', or 7" as illustrated in FIGS. 6A, 6B and 6C with reference to overshooting or undershooting in order to determine a comparatively accurate triggering time. Upon the occurrence of the comparatively-accurate triggering time, a triggering signal $S_{TR}$ is activated at the output of the unit for generating triggering signals 7, 7' or 7".

The preceding trigger-combining logic unit 29 can provide any possible kind of arithmetic and logical combining. In particular, with the first embodiment 5 of the system for digital triggering, it is possible to use a differential signal as the reference signal $S_i$. In this context, the two partial signals of the differential signal are each measured with a measuring probe with reference to ground potential, converted via an analog-digital converter into a corresponding digital data format and, in order to form the digital, differential signal, read in respectively by the trigger-combining logic unit 29 and subtracted from one another via a digitally-realized difference formation.

Figure 7B:
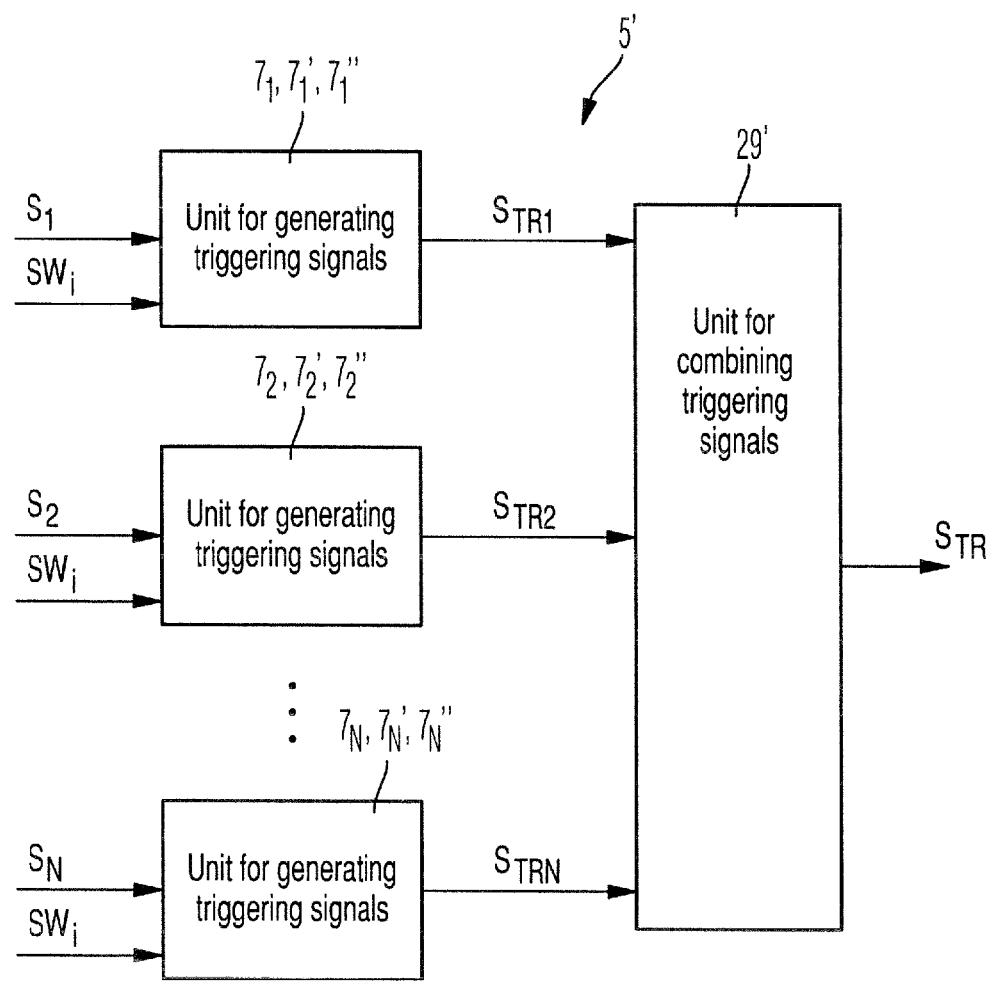

In a second embodiment 5' of the system for digital triggering shown in FIG. 7B, the signals $S_1, S_2, \ldots, S_N$ from all of the signals S to be presented on the digital oscilloscope used for the triggering are compared as reference signals in the respective unit for generating triggering signals $7_1$, $7_1'$, $7_1''$, $7_2$, $7_2'$, $7_2''$, ..., $7_N$, $7_N'$, $7_N''$ respectively with reference to overshooting or undershooting the same threshold value $SW_i$ in order to determine an associated triggering time for an associated triggering signal $S_{TR1}$, $S_{TR2}$, ..., $S_{TRN}$. In a subsequent unit for combining triggering signals 29', the individual triggering signals $S_{TR1}$, $S_{TR2}$, ..., $S_{TRN}$ are combined with one another in an arithmetic and/or logical manner to form a combined triggering signal $S_{TR}$.

The second embodiment 5' of the system for digital triggering shown in FIG. 7B is used when each individual signal used for the digital triggering is compared with an identical threshold value in order to determine a signal-specific triggering time. In this manner, it is possible to generate a triggering signal, which, by contrast with the first embodiment 5 shown in FIG. 7A realizes a more complex generation of triggering signals based upon several reference signals.

Figure 7C:
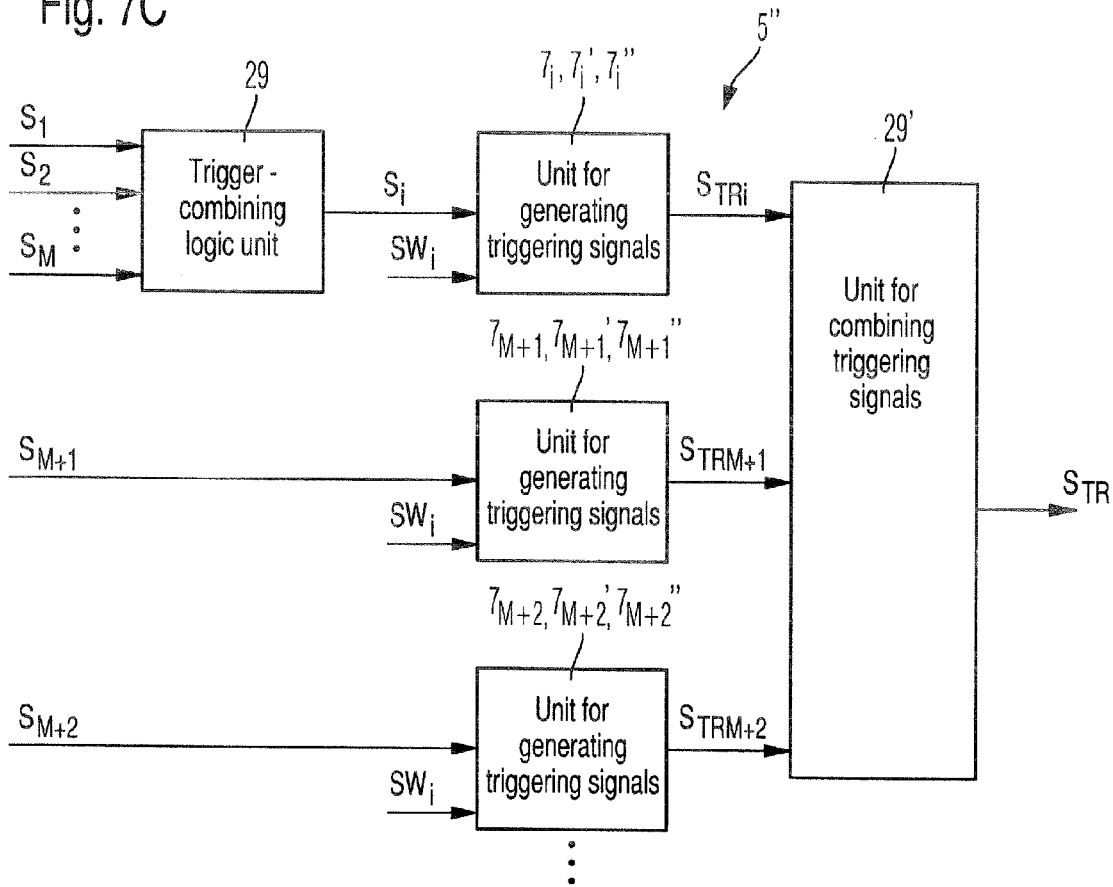

The third embodiment 5" of the system for digital triggering shown in FIG. 7C represents a combination of the first and second embodiments of the system for digital triggering shown in FIGS. 7A and 7B.

In the preceding trigger-combining logic unit 29, several signals $S_1$, $S_2$, ..., $S_N$ from several signals S to be displayed on the digital oscilloscope are combined in an arithmetic and/or logical manner with their reference signal $S_i$. The reference signal $S_i$ and two or more other signals $S_{M+1}$, $S_{M+2}$, ... acting as reference signals from several signals S to be presented on the digital oscilloscope are compared in each case in a first, second or third embodiment of the digital unit for generating triggering signals $7_i$, $7_i'$, $7_i''$, $7_{M+1}$, $7_{M+1}'$, $7_{M+1}''$, $7_{M+2}$, $7_{M+2}'$, $7_{M+2}''$, ... respectively with reference to overshooting or undershooting an identical threshold value $SW_i$. The triggering signals $S_{TRi}$, $S_{TRM+1}$, $S_{TRM+2}$, ... activated at the respectively determined triggering time are combined with one another in an arithmetic and/or logical manner in a subsequent unit for combining triggering signals 29' to form a combined triggering signal $S_{TR}$.

Figure 7D:
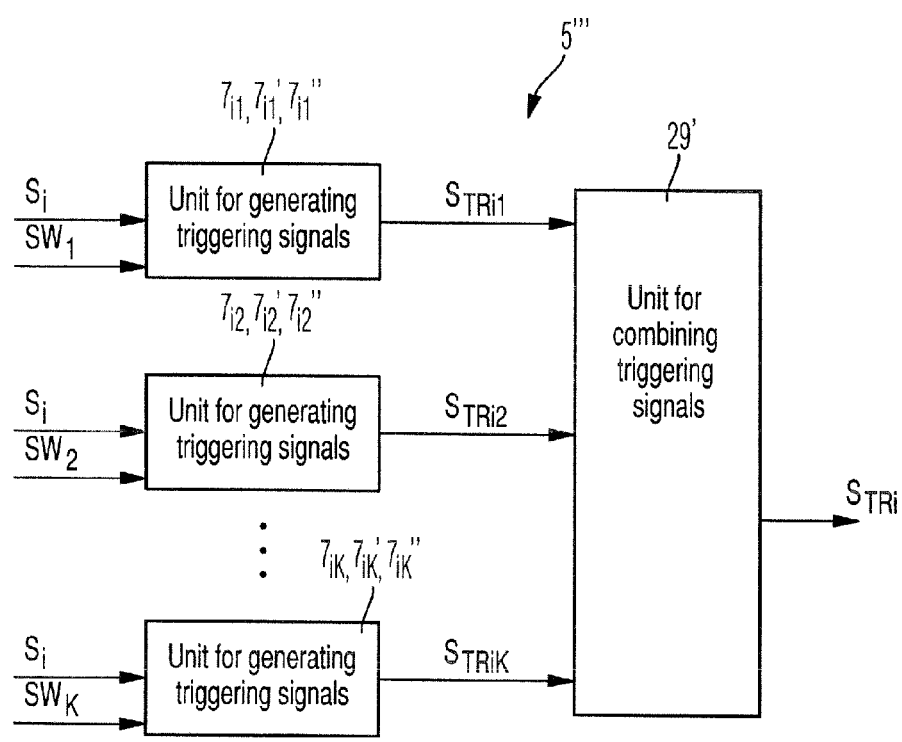

In a fourth embodiment 5''' of the system for digital triggering shown in FIG. 7D, a signal $S_i$ used for the triggering is compared respectively in a unit for generating triggering signals $7_{i1}$, $7_{i1}'$, $7_{i1}''$, $7_{i2}$, $7_{i2}'$, $7_{i2}''$, ..., $7_{ik}$, $7_{ik}'$, $7_{ik}''$ with reference to overshooting or undershooting a different threshold value $SW_1$, $SW_2$, ..., $SW_k$ in each case. The triggering signals $S_{TRi1}$, $S_{TRi2}$, ..., $S_{TRik}$ activated respectively at the identified triggering time by the individual units for generating triggering signals $7_{i1}$, $7_{i1}'$, $7_{i1}''$, $7_{i2}$, $7_{i2}'$, $7_{i2}''$, ..., $7_{ik}$, $7_{ik}'$, $7_{ik}''$ are combined with one another in an arithmetic and/or logical manner via a subsequent unit for combining triggering signals 29' to form a combined triggering signal $S_{TR}$.

With the fourth embodiment 5''' of the system for digital triggering shown in FIG. 7D, it is possible, on the basis of a signal $S_i$ determined for the triggering of a digital oscilloscope, to realize a more complex triggering condition composed of several threshold values $SW_1$, $SW_2$, ..., $SW_k$—for example, triggering with reference to given gradients of a signal slope or correlational triggering.

The comparison of a single signal $S_i$ with several threshold values $SW_1$, $SW_2$, ..., $SW_k$ is also transferable to a digital triggering system with several signals S determined for triggering in the sense of the second and third embodiment 5' and 5" of the system for digital triggering as shown in FIGS. 7B and 7C.

Figure 8A:
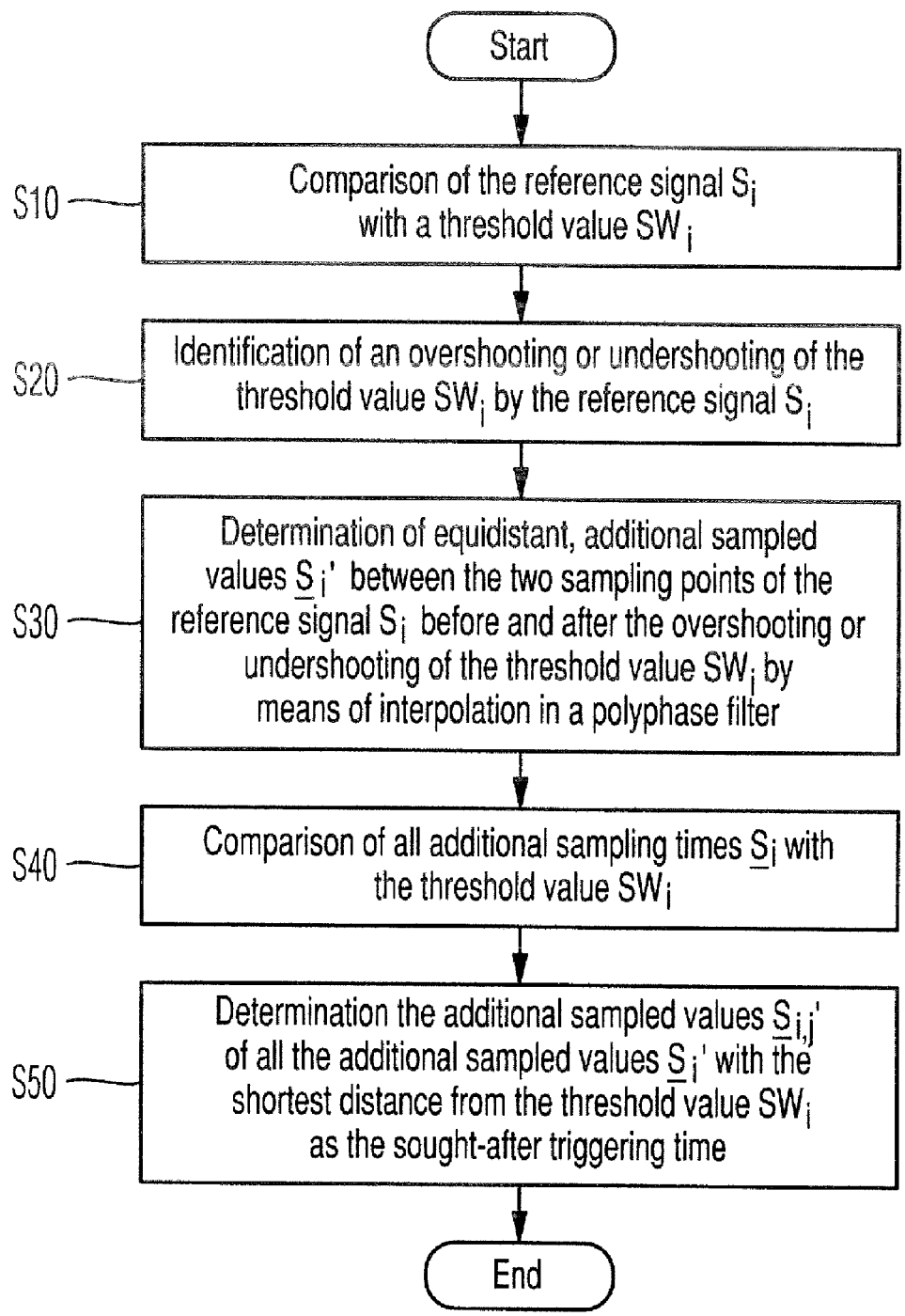
FIGS. 8A, 8B, 8C show flow charts of a the first, second, and third embodiments of a method for generating digital triggering signals.

The first, second and third embodiment of the method for digital generation of triggering signals is presented below with reference to FIGS. 8A, 8B and 8C:

In the first procedural stage S10 of the first embodiment of the method for digital generation of triggering signals shown in FIG. 8A, the sampled value $S_{i,j}$ of the digitized reference signal $S_i$ is compared with the threshold value $SW_i$ using the comparator 8.

In the subsequent procedural stage S20, the two sampled values $S_{i,j}$ and $S_{i,j-1}$ of the reference signal $S_i$, between which an overshooting or undershooting of the threshold value $SW_i$ by the two sampled values $S_{i,j}$ and $S_{i,j-1}$ of the reference signal $S_i$ occurs, are identified using the comparison results from procedural stage S10 and a slope detector 9.

In procedural stage S30, the additional sampled values $S_i'$ of the reference signal $S_i$, which are distributed at an equal distance between the sampled values $S_{i,j}$ and $S_{i,j-1}$ of the reference signal $S_i$ identified in procedural stage S20, are calculated by means of interpolation in a polyphase filter. The number of additional sampled values $S_i'$ of the reference signal $S_i$ used in this context determines the accuracy of the triggering time determined in the subsequent procedural stages. In this context, a technically-meaningful compromise must be found between the realized accuracy in determining the triggering time and the numerical cost of calculating the additional sampled values $S_i'$ of the reference signal $S_i$ by means of interpolation.

In the subsequent procedural stage S40, the additional sampled values $S_i'$ of the reference signal $S_i$ determined in procedural stage S30 between the two sampled values $S_{i,j}$ and $S_{i,j-1}$ of the reference signal $S_i$ identified in procedural stage S20 are compared in the comparator 14 with reference to overshooting or undershooting the threshold value $SW_i$.

In the final procedural stage S50, the additional sampled value $S_{i,j}'$ of the reference signal $S_i$, from all of the additional sampled values $S_i'$ of the reference signal $S_i$ identified between the two additional sampled values in procedural stage S20, is determined from the comparison results of procedural stage S40 using an evaluation logic unit 15, which provides the smallest level difference from the threshold value $SW_i$ and accordingly represents the comparatively most-accurate triggering time for the activation of the triggering signal $S_{TR}$.

Figure 11A:
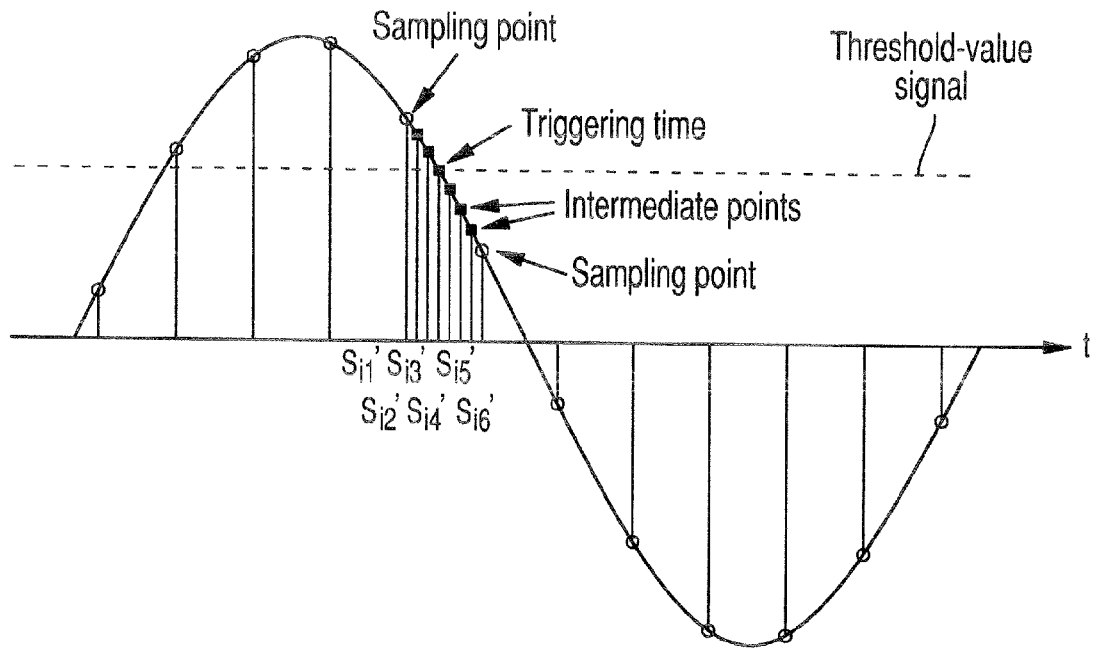
FIGS. 11A, 11B show a time characteristic of the digitized, measured signal according to the first and second embodiments of the method or respectively system for digital triggering.

With the example of a sinusoidal signal, which is used as a reference signal $S_i$ and a threshold value $SW_i$, FIG. 11A shows how, in the first embodiment of the method for generating triggering signals by calculating equidistant, additional sampled values $S_{i,1}'$, $S_{i,2}'$, $S_{i,3}'$, $S_{i,4}'$, $S_{i,5}'$, ... between two sampling points of the sinusoidal signal, of which the levels are disposed respectively below and above the level of the threshold value, the additional sampled value $S_{i,3}'$ of the reference signal $S_i$, which provides a minimum difference relative to the threshold value $SW_i$, is determined as a triggering time for a triggering signal.

Figure 8B:
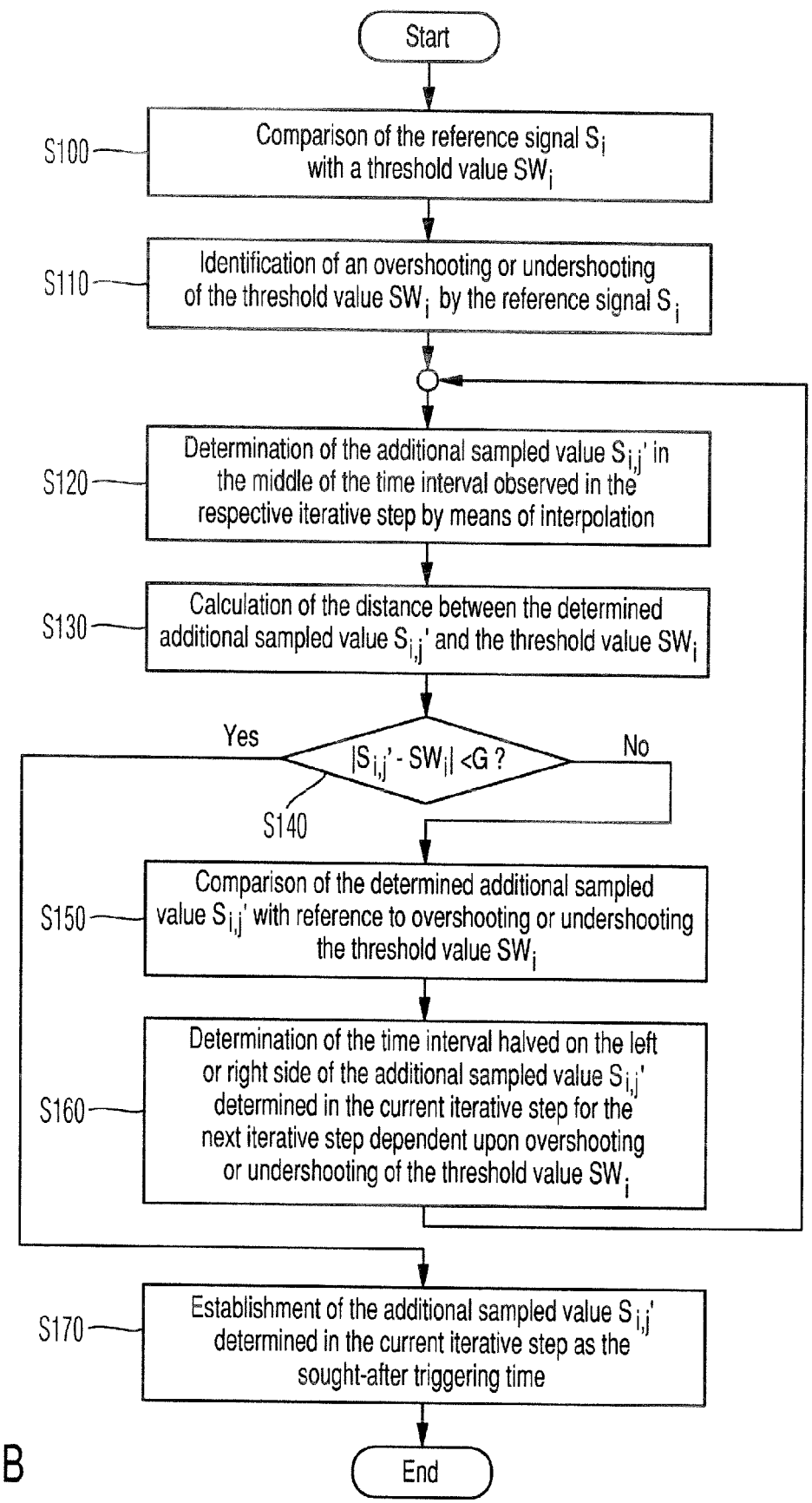

The second embodiment of the method for digital generation of triggering signals shown in FIG. 8B provides in its first two procedural stages S100 and S110 a procedural approach identical to procedural stages S10 and S20 of the first embodiment of the method for the digital generation of triggering signals shown in FIG. 8A.

In the subsequent procedural stage S120, in the first iterative step, the additional sampled value $S_{i,j}'$ of the reference signal $S_i$ in the middle of a time interval associated with the first iterative step is calculated by means of interpolation, wherein the two limits of the time interval associated with the first iterative step are the sampled values $S_{i,j}$, $S_{i,j-1}$ of the reference signal $S_i$ identified in procedural stage S110, between which an overshooting or undershooting of the threshold value $SW_i$ by the reference signal $S_i$ occurs. In a further iterative step j, the respective limits of the time interval are determined through the left or right limit of the time interval observed in the preceding iterative step j−1 and a sampled value $S_{i,j-1}$ of the reference signal $S_i$ determined in the preceding iterative step j−1, which is positioned in the middle of the time interval observed in the preceding iterative step j−1.

In the subsequent procedural stage S130, the additional sampled value $S_{i,j}'$ of the reference signal $S_i$ calculated by means of interpolation in procedural stage S120, which is positioned in the middle of the time interval observed in the respective iterative step j, is compared with reference to overshooting or undershooting the level of the threshold value $SW_i$.

In the subsequent procedural stage S140, the distance of the additional sampled value $S_{i,j}'$ of the reference signal $S_i$ determined in procedural stage S120, which is positioned in the middle of the time interval observed in the respective iterative step j, from the threshold value $SW_i$ is calculated.

If the comparison of the level difference between the additional sampled value $S_{i,j}'$ of the reference signal $S_i$ and the threshold value $SW_i$ with a specified limit value G implemented in procedural stage S140 still fails to provide an undershooting of the limit value G by the level difference between the additional sampled value $S_{i,j}'$ of the reference signal $S_i$ and the threshold value $SW_i$, the additional sampled value $S_{i,j}'$ of the reference signal $S_i$ is compared, in procedural stage S150, with reference to overshooting or undershooting the threshold value $SW_i$.

On the basis of the comparison from procedural stage S150, the time interval to be observed in the subsequent iterative step j+1 is determined in the next procedural stage S160. The half of the time interval observed in iterative step j disposed on the left of the additional sampled value $S_{i,j}'$ of the reference signal $S_i$ observed in procedural stage S120 is pursued further if, in the case of a selected, positive slope triggering, the additional sampled value $S_{i,j}'$ of the reference signal $S_i$ overshoots the threshold value $SW_i$ or in the case of a selected, negative slope triggering, if the additional sampled value $S_{i,j}'$ of the reference signal $S_i$ undershoots the threshold value SWi. By contrast, the half of the time interval observed in iterative step j disposed on the right of the additional sampled value $S_{i,j}'$ of the reference signal $S_i$ observed in procedural stage S120 is pursued further in the subsequent iterative step j+1, if, in the case of a selected positive slope triggering, the additional sampled value $S_{i,j}'$ of the reference signal $S_i$ undershoots the threshold value $SW_i$ or, in the case of a selected, negative slope triggering, if the additional sampled value $S_{i,j}'$ of the reference signal $S_i$ overshoots the threshold value $SW_i$. Following this, in procedural stage S120, the additional sampled value $S_{i,j+1}'$ of the reference signal $S_i$ in the middle of the time interval observed in iterative step j+1 is determined by interpolation.

By contrast, if the comparison in procedural stage S140 of the level difference between the additional sampled value $S_{i,j}'$ of the reference signal $S_i$ and the threshold value $SW_i$ with a specified limit value G provides an undershooting of the limit value G by the level difference between the additional sampled value $S_{i,j}'$ of the reference signal $S_i$ and the threshold value $SW_i$, the iterative procedure is terminated and, in procedural stage S170, the additional sampled value $S_{i,j}'$ of the reference signal $S_i$ determined in the current iterative step j is established as the sought-after triggering time for the triggering signal $S_{TR}'$.

Figure 11B:
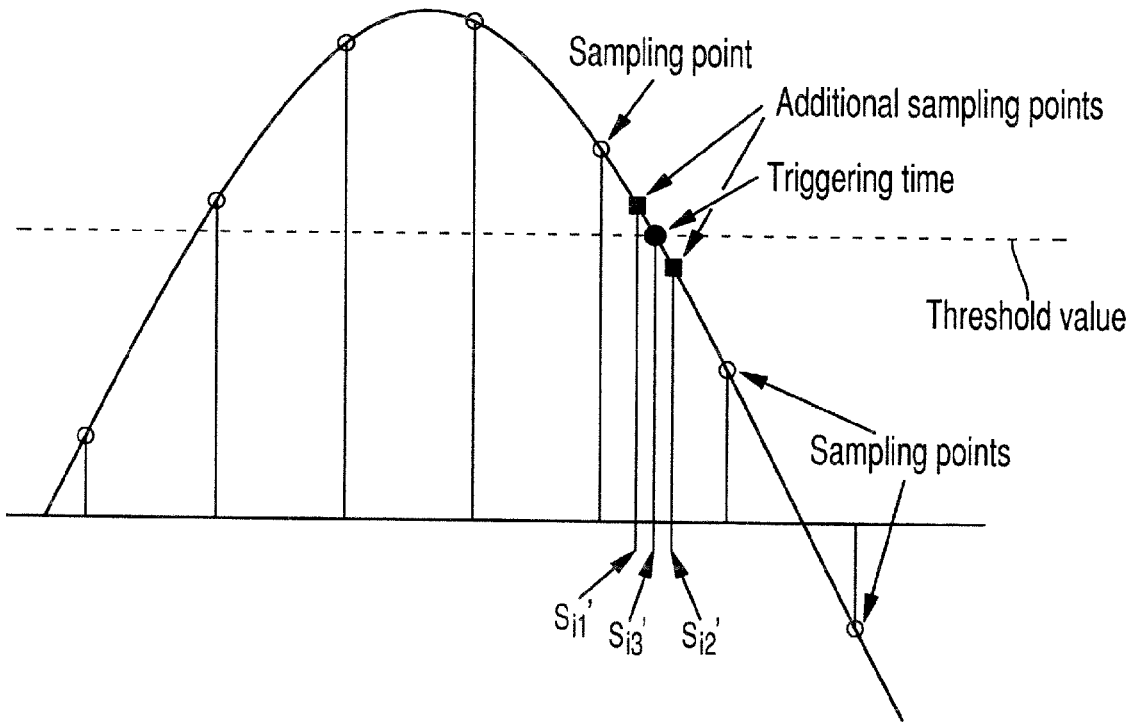

With the example of a sinusoidal signal and a specified threshold value, FIG. 11B shows how, in the second embodiment of the method for generating triggering signals, the additional sampled value $S_{i,j}'$ of the reference signal $S_i$, which provides the minimum difference relative to the threshold value, is determined as the triggering time of the triggering signal by an iterative determination of additional sampled values $S_{i,1}$, $S_{i,2}$ and $S_{i,3}$.

The third embodiment of the method for generating triggering signals shown in FIG. 6C, which expands the second embodiment of the method for generating triggering signals as shown in FIG. 6B, contains the procedural stages S100, S110, S120, S130, S140, S150 and S160 of the second embodiment of the method for generating triggering signals within its procedural stages S200, S210, S220, S230, S240, S250 and S260.

In the final procedural stage S270, on the basis of the additional sampled values $S_{i,j}'$ and $S_{i,j-1}'$ of the reference signal $S_i$ determined in the last two iterative steps j and j−1 together with their associated sampling times and the threshold value SWi, the intersection between threshold value $SW_i$ and the reference signal $S_i$ is calculated by means of linear interpolation as a more precise triggering time of the triggering signal $S_{TR}''$.

Figure 9A:
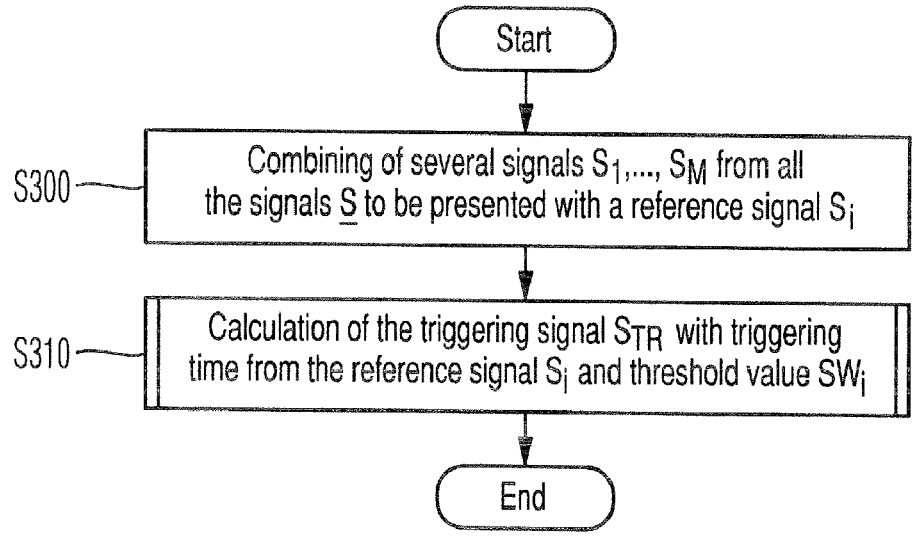
FIGS. 9A, 9B, 9C and 9D show flow charts of a the first, second, third and fourth embodiments of a method for digital triggering.

In the following section, the first, second, third and fourth embodiments of the method for digital triggering are described with reference to FIGS. 9A, 9B, 9C, and 9D:

In procedural stage S300 of the first embodiment of the method for digital triggering shown in FIG. 9A, several signals $S_1, S_2, \ldots, S_N$ from all of the signals S to be presented on the digital oscilloscope, which are used for the triggering, are combined with one another in an arithmetic and/or logical manner in a trigger-combining logic unit 29.

Figure 8C:
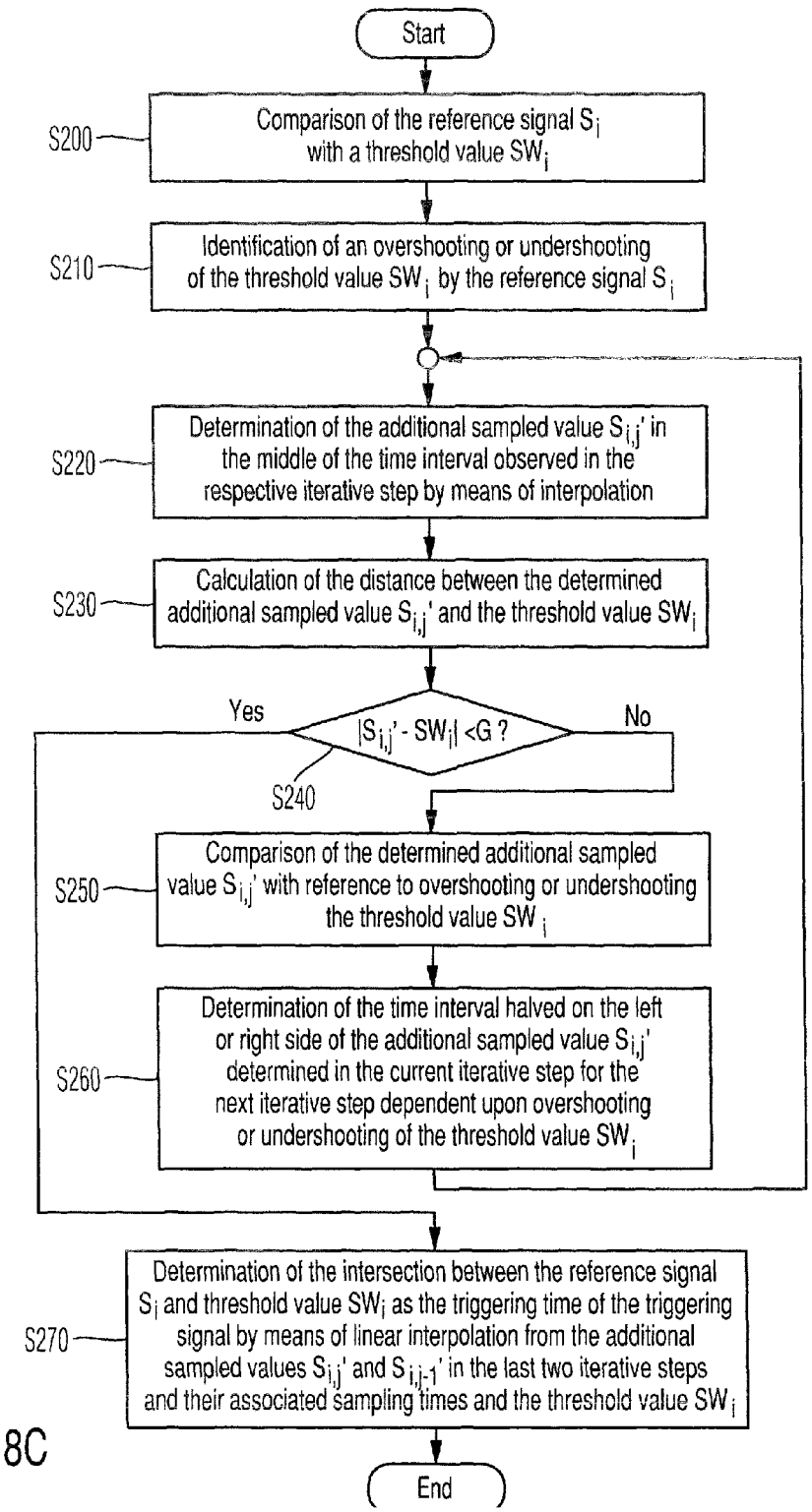

In the subsequent procedural stage S310, the reference signal $S_i$ is compared using the first, second or third embodiment of the method for generating triggering signals as shown in FIGS. 8A, 8B and 8C, with a threshold value $SW_i$ in a unit for generating triggering signals 7, 7' or 7", and a triggering signal $S_{TR}$ with a corrected triggering time without triggering offset is determined from the comparison result.

Figure 9B:
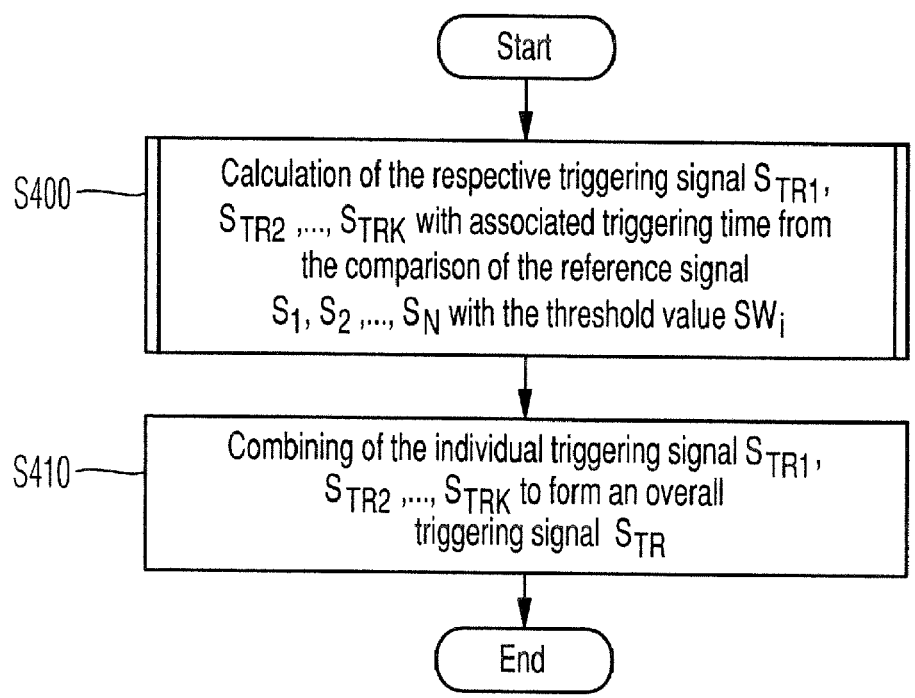

In procedural stage S400 of the second embodiment of the method for digital triggering shown in FIG. 9B, several signals $S_i, S_2, \ldots, S_N$ from all of the signals S to be presented on the digital oscilloscope, which are used for the triggering, are compared in each case individually using the first, second or third embodiment of the method for generating triggering signals as shown in FIGS. 8A, 8B and 8C, with a threshold value $SW_i$ in a unit for generating triggering signals 7, 7' or 7", and a triggering signal $S_{TR1}, S_{TR2}, \ldots, S_{TRN}$ with a corrected triggering time without triggering offset is generated respectively from the comparison result.

The triggering signals $S_{TR1}, S_{TR2}, \ldots, S_{TRN}$ generated respectively in procedural stage S400 are then combined with one another in procedural stage S410 in a unit for combining triggering signals 29' to form a combined triggering signal $S_{TR}$.

Figure 9C:
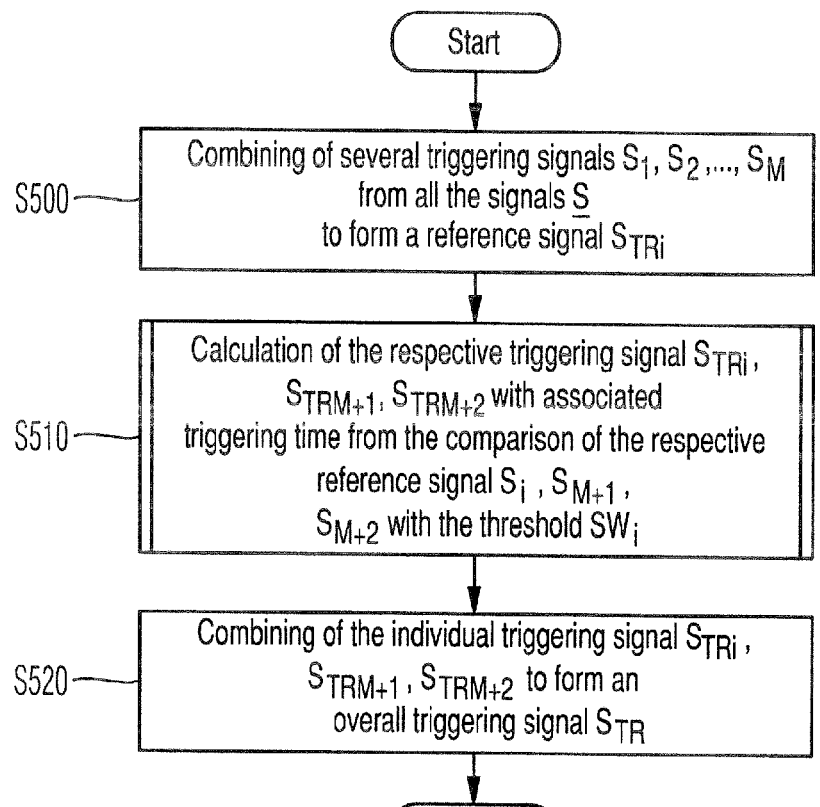

The third embodiment of the method for digital triggering shown in FIG. 9C, as a combination of the first and second embodiment of the method for digital triggering as shown in FIGS. 9A and 9B, contains in its first procedural stage S500 procedural stage S300 of the first embodiment of the method for digital triggering as shown in FIG. 9A, and, in its subsequent procedural stages S510 and S520, contains procedural stages S400 and S410 of the second embodiment of the method for digital triggering as illustrated in FIG. 9B.

Figure 9D:
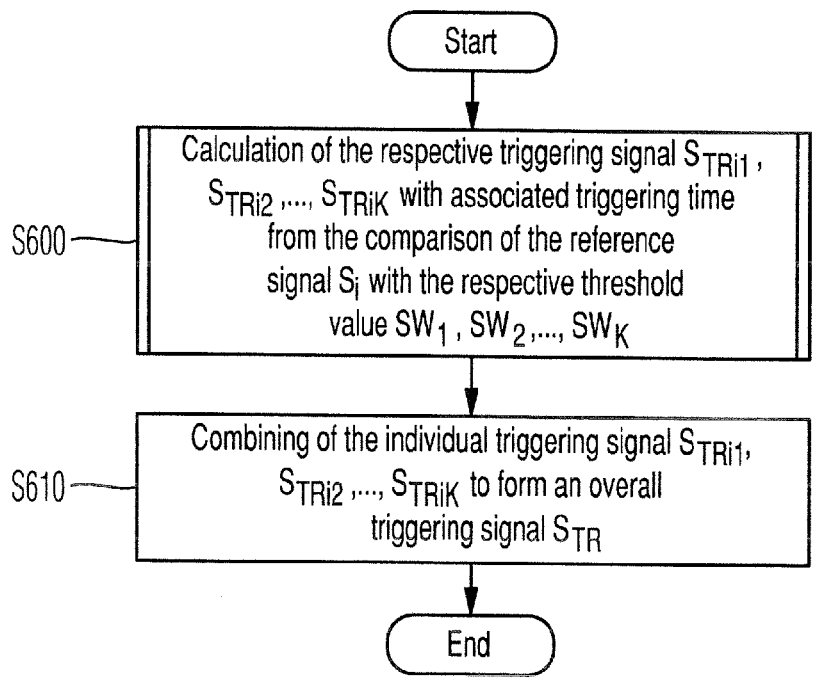

In procedural stage S600 of the fourth embodiment of the method for digital triggering as shown in FIG. 9D, a signal $S_i$ provided for the triggering from all of the signals S to be presented on the digital oscilloscope is compared, using the first, second or third embodiment of the method for digital generation of triggering signals as shown in FIGS. 8A, 8B and 8C, in each case with a different threshold value $SW_1$, $SW_2, \ldots, SW_k$ respectively in a unit for generating triggering signals 7, 7' or 7", and a triggering signal $S_{TR1}, S_{TR2}, \ldots, S_{TRN}$ with a corrected triggering time without triggering offset is generated respectively from the comparison result.

The triggering signals $S_{TR1}, S_{TR2}, \ldots, S_{TRN}$ generated respectively in procedural stage S600 are combined with one another in the subsequent procedural stage S610 in a unit for combining triggering signals 29' to form a combined triggering signal $S_{TR}$.

If the comparison of the reference signal $S_i$ with the threshold value $SW_i$ in the comparator 8, 8' or 8" shows that the levels of two successive sampled values $S_{i,j}$, $S_{i,j-1}$ of the reference signal $S_i$ are disposed below the threshold value $SW_i$, it may, under some circumstances, occur, that, as a result of an excessively-low sampling rate, the reference signal $S_i$ between the two successive sampled values $S_{i,j}$, $S_{i,j-1}$ of the reference signal $S_i$ overshoots the threshold value $SW_i$ without bringing about a triggering. Accordingly, it can also occur that, in the case of an overshooting of the threshold value $SW_i$ by the two successive sampled values $S_{i,j}$, $S_{i,j-1}$ of the reference signal $S_i$, the reference signal $S_i$ between the two successive sampled values $S_{i,j}$, $S_{i,j-1}$ undershoots the threshold $SW_i$ as a result of an excessively-low sampling rate without bringing about a triggering.

Accordingly, the first, second and third embodiments of the method for generating triggering signals shown in FIGS. 8A, 8B and 8C are used in order either unambiguously to identify or unambiguously not to identify an overshooting or an undershooting of the threshold value $SW_i$ via the determination of additional sampled values $S_{i,j}''$ between the two successive sampled values $S_{i,j}$ and $S_{i,j-1}$. The fourth, fifth and sixth embodiments of the method for generating triggering signals developed from the latter are presented in FIGS. 10A, 10B and 10C.

Figure 10A:
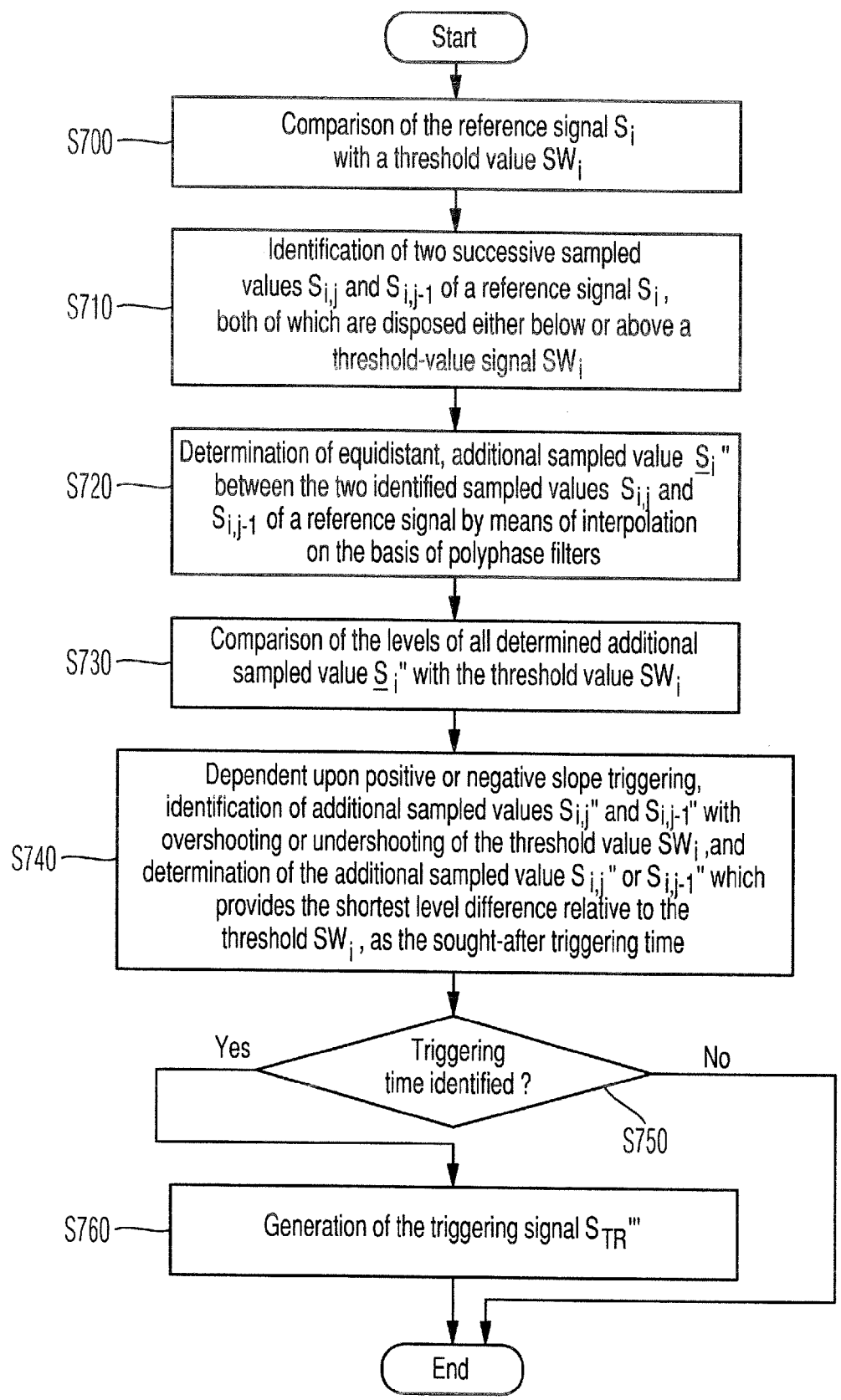
FIGS. 10A, 10B and 10C show flow charts of the fourth, fifth and sixth embodiments of a method for generating digital triggering signals.

The fourth embodiment of the method for generating triggering signals shown in FIG. 10A corresponds in its first procedural stage S700 to the first procedural stage S10 of the first embodiment.

By contrast with the second procedural stage S20 of the first embodiment, the subsequent, second procedural stage S710 of the fourth embodiment investigates whether two successive sampled values $S_{i,j}$ and $S_{i,j-1}$ of the reference signal $S_i$ are disposed respectively below or above the threshold value $SW_i$.

If the sampled values $S_{i,j}$ and $S_{i,j-1}$ of the reference signal $S_i$ are both disposed respectively above or below the threshold value $SW_i$, additional sampled values $S_i''$ between the two sampled values $S_{i,j}$ and $S_{i,j-1}$ of the reference signal $S_i$ identified in procedural stage S710 are calculated in the subsequent procedural stage S720 by means of interpolation.

The determined additional sampled values $S_i''$ are compared with the threshold value $SW_i$ in the next procedural stage S730.

In procedural stage S740, dependent upon a positive or negative slope triggering, those additional sampled values $S_{i,j}''$ and $S_{i,j-1}''$ of the reference signal $S_i$, between which the threshold value $SW_i$ is disposed, are identified, and finally, in the case of an identification, the additional sampled value $S_{i,j}''$ or $S_{i,j-1}''$ of the reference signal $S_i$, which provides the shortest distance from the threshold value $SW_i$, is determined as the sought-after triggering time for the triggering signal $S_{TR}'''$.

If a triggering event is identified according to procedural stage S750, a triggering signal $S_{TR}'''$ is generated in procedural stage S760, which is activated at the identified triggering time.

Figure 12A:
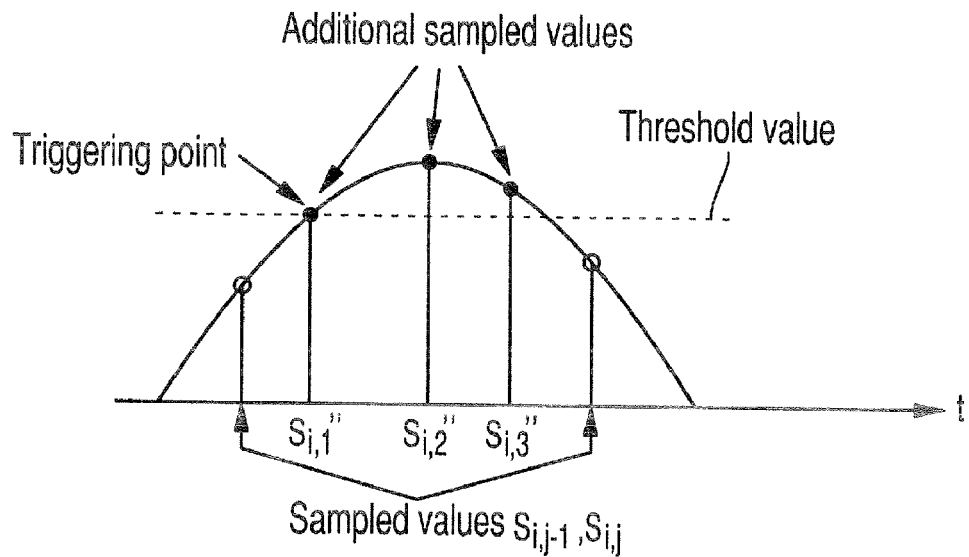
FIGS. 12A, 12B show a time characteristic of the digitized measured signal according to the fourth and fifth embodiments of the method or respectively system for generating digital triggering signals.

For a sinusoidal reference signal $S_i$ and a given threshold value $SW_i$, FIG. 12A shows the equidistant, additional sampled values $S_{i,1}''$, $S_{i,2}''$ and $S_{i,3}''$ of the reference signal $S_i$ between the two sampled values $S_{i,j}$ and $S_{i,j-1}$ of the reference signal $S_i$, of which the levels are both disposed below the threshold value, together with the additional sampled value $S_{i,3}''$ identified as the triggering point.

Figure 10B:
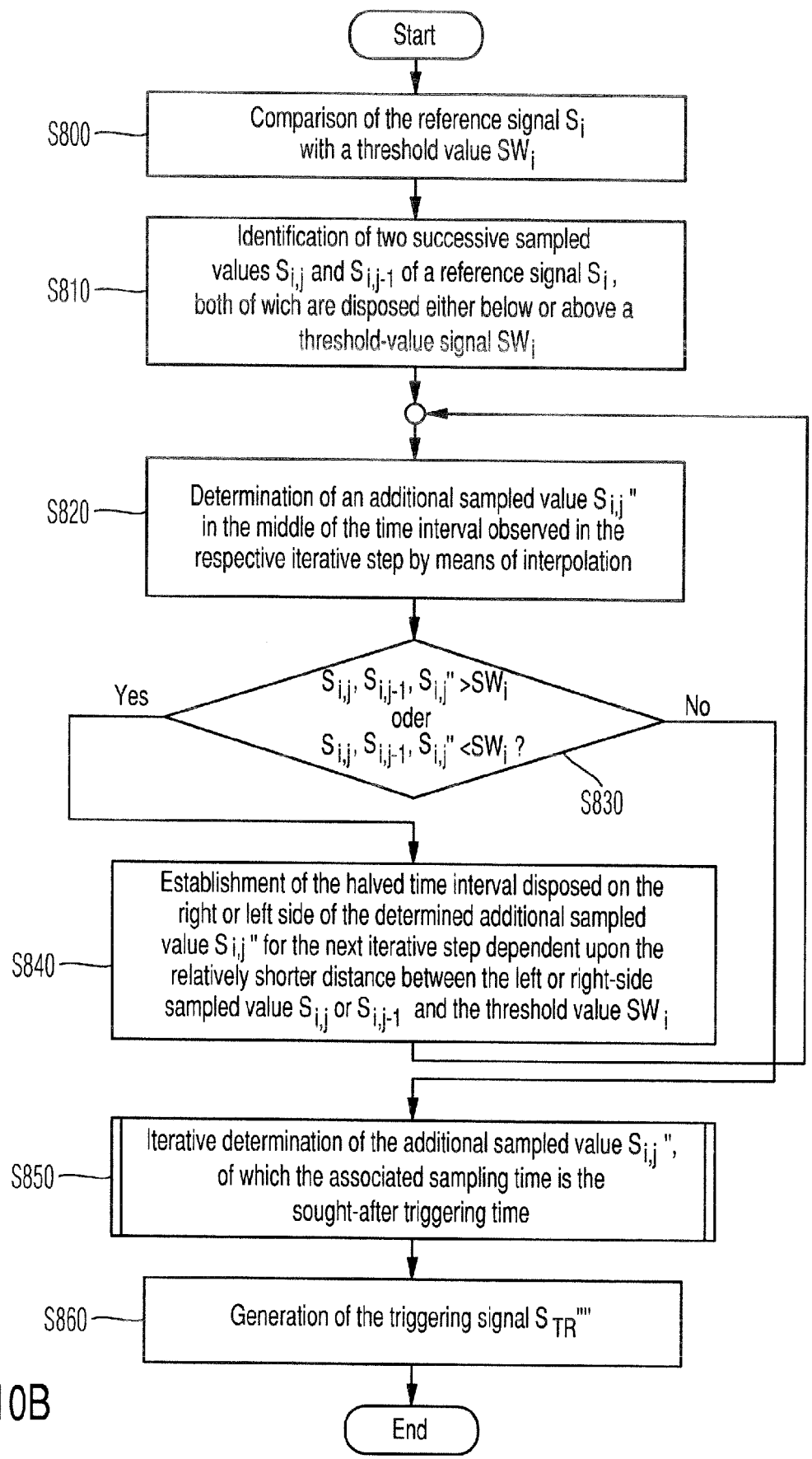

The fifth embodiment of the method for generating triggering signals shown in FIG. 10B corresponds in its first procedural stage S800 to the first procedural stage S100 of the second embodiment.

By way of difference from procedural stage S110 of the second embodiment, in procedural stage S810 of the fifth embodiment, two successive sampled values $S_{i,j}$ and $S_{i,j-1}$ of the reference signal $S_i$ are identified, both of which are either disposed below or above the threshold value $SW_i$.

In the subsequent procedural stage S820, an additional sampled value $S_{i,j}''$ of the reference signal $S_i$, which is disposed in the middle of the time interval observed in the respective iterative step, is calculated by interpolation within the framework of an iteration. In the first iterative step, the time interval between the successive sampled values $S_{i,j}$ and $S_{i,j-1}$ of the reference signal $S_i$ is observed.

In the next procedural stage S830, a check is implemented to determine whether the successive sampled values $S_{i,j}$ and $S_{i,j-1}$ and the additional sampled value $S_{i,j}''$ of the reference signal $S_i$ determined in the current iterative step are all disposed above or all below the threshold value $SW_i$.

If this is the case, in a further iterative step, an additional sampled value $S_{i,j}''$ of the reference signal $S_i$ must be determined within a time interval, which is disposed within the time interval of the current iterative step and which is halved relative to the latter. For this purpose, in procedural stage S840, the halved time interval, which is disposed either to the left or to the right of the additional sampled value $S_{i,j}''$ of the reference signal $S_i$ determined in the current iterative step, is selected, which is disposed between that sampled value $S_{i,j}$ and $S_{i,j-1}$ and the additional sampled value $S_{i,j}''$ of the reference signal $S_i$ determined in the current iterative step, which provides the relatively-shorter distance from the threshold value $SW_i$. In general, within one to two iterative cycles, an overshooting or an undershooting of the threshold value $SW_i$ by the reference signal $S_i$ is unambiguously identified or unambiguously not identified (in view of the frequency limiting of the reference signal $S_i$ because of the sampling theorem).

If an overshooting or an undershooting of the threshold value $SW_i$ by the reference signal $S_i$ is registered in procedural stage S830, a more precise intersection between the threshold value $SW_i$ and the reference signal $S_i$ is determined in procedural stage S850 through the iterative calculation of additional sampled values $S_i''$ within the time interval observed in the last iterative step. Procedural stage S850 contains substantially procedural stages S120 to S160 of the second embodiment of the method for generating triggering signals as shown in FIG. 8B.

Finally, in the concluding procedural stage S860, a triggering signal $S_{TR}''''$ is generated on the basis of the triggering time determined in procedural stage S850.

Figure 12B:
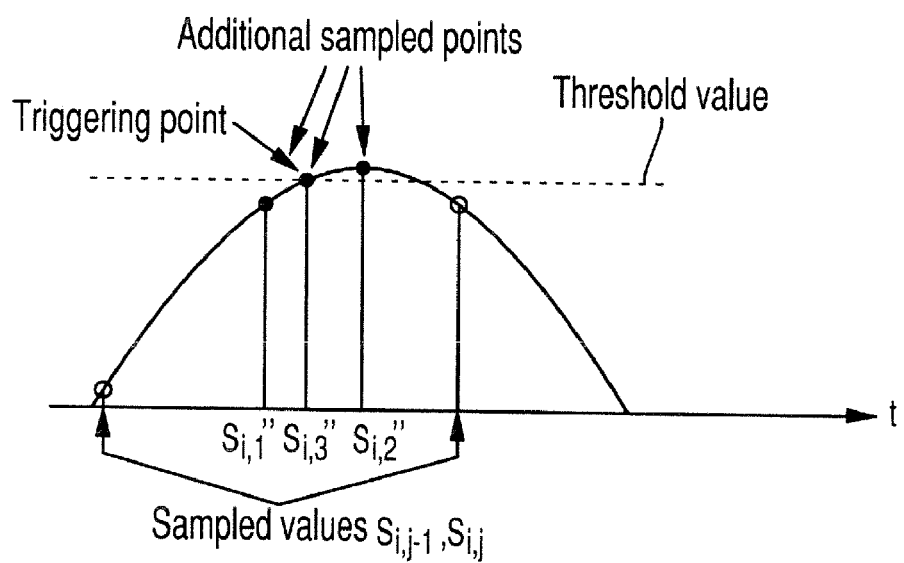

FIG. 12B presents the approximation of the additional sampled values $S_{i,1}''$, $S_{i,2}''$ and $S_{i,3}''$ of the reference signal $S_i$ to the triggering point (additional sampled value $S_{i,3}''$) using the fifth embodiment of the method for generating triggering signals on the basis of an iterative halving of the time interval.

Figure 10C:
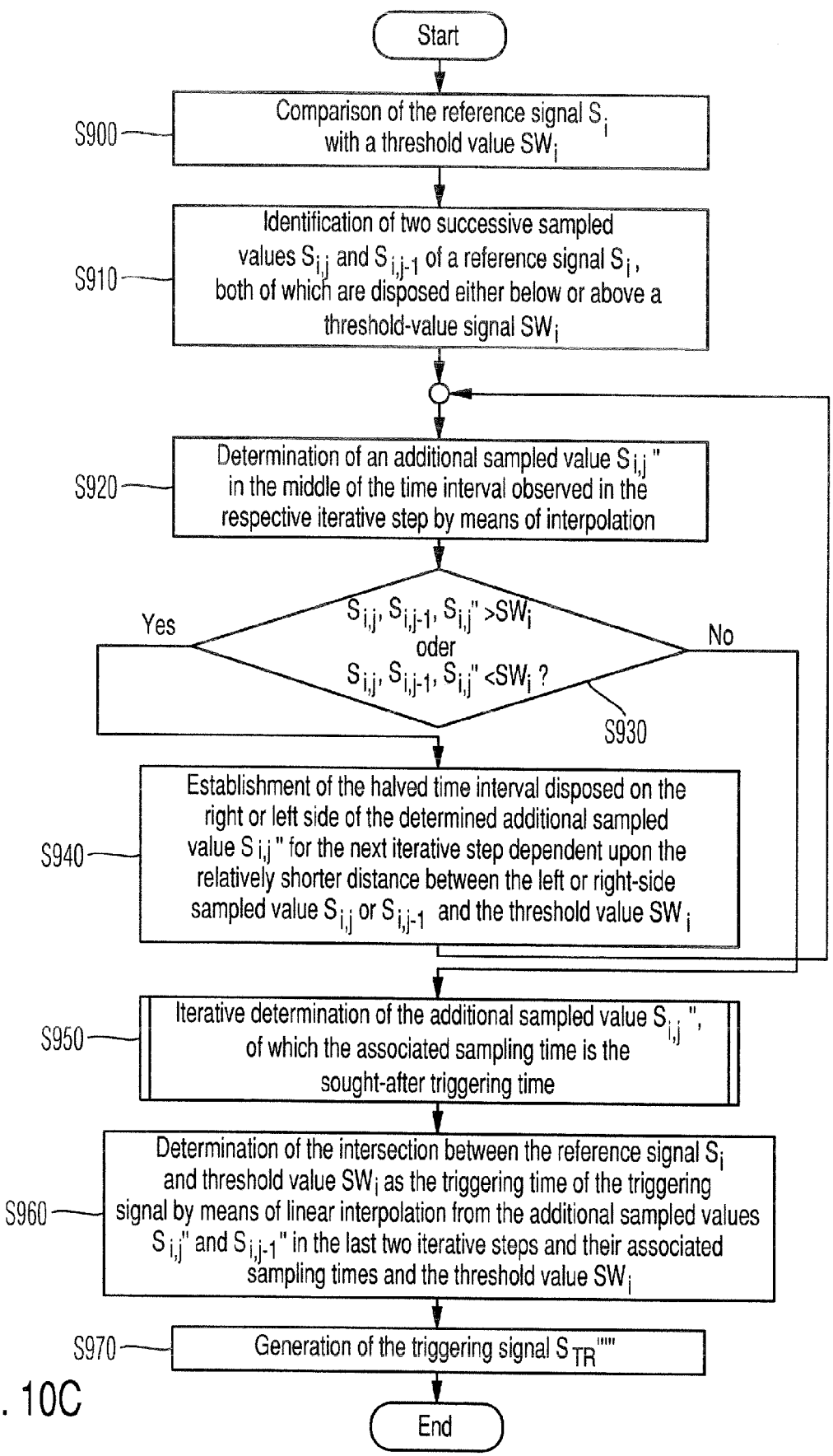

FIG. 10C presents a sixth embodiment of the method for generating triggering signals, of which the procedural stages S900 to S950 correspond to the procedural stages S800 to S850 of the fifth embodiment of the method for generating triggering signals as illustrated in FIG. 10A.

By analogy with procedural stage S270 of the third embodiment, in procedural stage S960 of the sixth embodiment, a more precise triggering time is calculated as the intersection between the threshold value $SW_i$ and the reference signal $S_i$ by means of linear interpolation between the time interval observed in the last iterative step of procedural stage S950—the additional sampled values $S_{i,j}"$ and $S_{i,j+1}'$ of the reference signal $S_i$ determined in the last two iterative steps.

Finally, in the concluding procedural stage S970, a triggering signal $S_{TR}""$ is generated on the basis of the triggering time determined in procedural stage S960.

While the invention has been described in connection with a number of embodiments and implementations, the invention is not so limited but covers various obvious modifications and equivalent arrangements, which fall within the purview of the appended claims. Although features of the invention are expressed in certain combinations among the claims, it is contemplated that these features can be arranged in any combination and order.

The invention claimed is:

1. A method for digital triggering a recording of one or more signals on a digital oscilloscope comprising:
   implementing a level comparison in order to determine a triggering time respectively between two successive sampled values of a reference signal on the digital oscilloscope and a threshold value; and
   determining at least one additional sampled value of the reference signal between the two successive sampled values of the reference signal,
   wherein the at least one additional sampled value of the reference signal between the two successive sampled values of the reference signal is calculated by interpolation, if the threshold value is disposed either above both of or below both of the two successive sampled values of the reference signal, and
   wherein the at least one additional sampled value is used in the determining of the triggering time between the two successive sampled values.

2. A method according to claim 1, wherein the triggering time is disposed between two successive sampled values of the reference signal if an overshooting or undershooting of the threshold value by the reference signal is present between the two successive sampled values of the reference signal.

3. A method according to claim 2, wherein an overshooting of the threshold value by the reference signal is present between the two successive sampled values of the reference signal if the one sampled value is less than the threshold value and the other sampled value is greater than or equal to the threshold value.

4. A method according to claim 2, wherein an undershooting of the threshold value by the reference signal is present between the two successive sampled values of the reference signal, when one sampled value of the two successive sampled values is greater than the threshold value and another sampled value of the two successive sampled values is less than or equal to the threshold value.

5. A method according to claim 2, wherein the triggering time between two successive sampled values of the reference signal is calculated by linear interpolation.

6. A method according to claim 1, wherein the at least one additional sampled value of the reference signal is distributed at an equal distance between two successive sampled values of the reference signal.

7. A method according to claim 1, wherein plural additional sampled values of the at least one additional sampled value of the reference signal are determined iteratively by interpolation respectively in the middle of a time interval that is halved relative to a time interval observed in a preceding iterative step.

8. A method according to claim 7, wherein the time interval observed in a current iterative step is the nearest relatively-earlier time interval relative to an additional sampled value of the plural additional sampled values determined in the preceding iterative step if the threshold value is disposed between the additional sampled value of the reference signal determined in the preceding iterative step and the nearest relatively-earlier sampled value of the reference signal.

9. A method according to claim 7, wherein:
the time interval observed in the iterative step is the relatively-later time interval relative to an additional sampled value of the plural additional sampled values determined in the preceding iterative step, if the threshold value is disposed between the additional sampled value of the reference signal determined in the preceding iterative step and a relatively-later sampled value of the plural additional sampled values.

10. A method according to claim 1, wherein the at least one additional sampled value of the reference signal and respectively nearest relatively-earlier and nearest relatively-later sampled values of the reference signal are compared respectively with the threshold value in order to identify an overshooting or undershooting of the threshold value by the reference signal between the at least one additional sampled value of the reference signal and the respectively nearest relatively-earlier and nearest relatively-later sampled values of the reference signal.

11. A method according to claim 1, wherein the at least one additional sampled values of the reference signal is determined by interpolation and distributed at an equal distance between the two successive sampled values of the reference signal.

12. A method according to claim 1, wherein plural additional sampled values of the at least one additional sampled value of the reference signal are determined iteratively by linear interpolation in the proximity of the two successive sampled values of the reference signal, which provides a smaller level difference relative to the level of the threshold value.

13. A method according to claim 1, wherein a calculation of the triggering time is implemented online during a measurement of the signals or offline after the conclusion of the measurement of the signals.

14. A method according to claim 1, wherein the reference signal is compared with an upper threshold-value level with reference to overshooting and with a lower threshold-value level with reference to undershooting.

15. A method according to claim 1, wherein the reference signal is determined from one or more of the signals to be presented on the digital oscilloscope by signal combining.

16. A method according to claim 15,
wherein both partial signals of a differential signal are measured respectively against the ground potential, and combined by differential signal combining to provide a differential signal, which forms the reference signal.

17. A method according to claim 1,
wherein before determination of the reference signal from individual signals to be presented on the digital oscilloscope, transmission-time differences in the measurement channels associated respectively with the signals to be presented are removed by determination of the transmission-time differences between the individual signals to be presented and by compensation of the transmission-time differences in the individual signals to be presented.

18. A system for digitally triggering of a recording of one or more signals for a digital oscilloscope, comprising:
at least one comparator, wherein a level comparison is implemented respectively between two successive sampled values of a reference signal on the digital oscilloscope and a threshold value; and
a unit is configured to determine first additional sampled values of the reference signal between two successive sampled values of the reference signal by interpolation,
wherein in the case of an identification of a threshold value disposed either above both of or below both of two successive sampled values of the reference signal, a calculation of second additional sampled values of the reference signal between the two successive sampled values of the reference signal is implemented by the unit for the determination of the first additional sampled values of the reference signal that are used to determine a triggering time between the two successive sampled values.

19. A system according to claim 18,
wherein each comparator provides a hysteresis with an upper and lower threshold value, wherein the upper threshold value is used in the case of an overshooting of the reference signal and the lower threshold value is used in the case of an undershooting of the reference signal.

20. A system according to claim 19,
wherein the upper and lower threshold value are each adjustable.

21. A system according to claim 18, further comprising:
a trigger-combining logic unit for the formation of the reference signal from one or more of the signals to be presented on the digital oscilloscope is connected upstream of each comparator.

22. A digital oscilloscope, comprising:
a pre-amplifier configured to level match at least one signal to be presented on the digital oscilloscope;
an analog-digital converter configured to perform analog-digital conversion of the at least one signal to be presented; and
a digital triggering system configured to determine a triggering time and a recording unit for the presentation of the at least one signal to be presented,
wherein the digital triggering system determines each triggering time occurring, which provides a higher time resolution than the sampling rate of the analog-digital converter, and
wherein an equalizer system configured to perform compensation of linear and non-linear distortions in each of the at least one signal to be presented is connected downstream of the analog-digital converter.

23. A digital oscilloscope according to claim 22, further comprising:
a unit for the compensation of transmission-time differences in measurement channels associated with the at least one signal to be presented is connected upstream of the digital triggering system and the recording unit.

* * * * *